United States Patent
Kang et al.

(10) Patent No.: US 11,069,818 B2
(45) Date of Patent: Jul. 20, 2021

(54) SEMICONDUCTOR DEVICE

(71) Applicant: Samsung Electronics Co., Ltd., Suwon-si (KR)

(72) Inventors: Myung Gil Kang, Suwon-si (KR); Dong Won Kim, Seongnam-si (KR); Geum Jong Bae, Suwon-si (KR); Kwan Young Chun, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 60 days.

(21) Appl. No.: 16/435,657

(22) Filed: Jun. 10, 2019

(65) Prior Publication Data
US 2020/0091349 A1 Mar. 19, 2020

(30) Foreign Application Priority Data

Sep. 14, 2018 (KR) .................. 10-2018-0110127
Jan. 17, 2019 (KR) .................. 10-2019-0006151

(51) Int. Cl.
| | |
|---|---|
| *H01L 29/786* | (2006.01) |
| *H01L 27/092* | (2006.01) |
| *H01L 27/11* | (2006.01) |
| *H01L 29/423* | (2006.01) |
| *H01L 29/06* | (2006.01) |

(52) U.S. Cl.
CPC .... *H01L 29/78696* (2013.01); *H01L 27/0922* (2013.01); *H01L 27/1104* (2013.01); *H01L 27/1116* (2013.01); *H01L 29/0673* (2013.01); *H01L 29/42392* (2013.01)

(58) Field of Classification Search
CPC ............ H01L 27/0922; H01L 27/1104; H01L 27/1116; H01L 29/78696; H01L 29/0673; H01L 29/42392
See application file for complete search history.

(56) References Cited

U.S. PATENT DOCUMENTS

| | | |
|---|---|---|
| 9,219,064 B2 | 12/2015 | Kim |
| 9,324,850 B2 | 4/2016 | Kang et al. |
| 9,653,289 B1 | 5/2017 | Balakrishnan et al. |
| 9,704,863 B1 | 7/2017 | Cheng et al. |
| 9,935,204 B2 | 4/2018 | Lee et al. |
| 2017/0170331 A1* | 6/2017 | Liang .................. H01L 27/1116 |
| 2018/0261593 A1 | 9/2018 | Cheng et al. |

FOREIGN PATENT DOCUMENTS

KR    10-2007-0068725 A    7/2007

\* cited by examiner

*Primary Examiner* — Sue A Purvis
*Assistant Examiner* — Scott Stowe
(74) *Attorney, Agent, or Firm* — Muir Patent Law, PLLC

(57) ABSTRACT

A semiconductor device is provided. The semiconductor device includes: a first wire pattern disposed on a substrate and extending in a first direction; a first gate electrode surrounding the first wire pattern and extending in a second direction, the first direction intersecting the second direction perpendicularly; a first transistor including the first wire pattern and the first gate electrode; a second wire pattern disposed on the substrate and extending in the first direction; a second gate electrode surrounding the second wire pattern and extending in the second direction; and a second transistor including the second wire pattern and the second gate electrode, wherein a width of the first wire pattern in the second direction is different from a width of the second wire pattern in the second direction.

20 Claims, 18 Drawing Sheets

SEMICONDUCTOR DEVICE

CROSS-REFERENCE TO RELATED APPLICATIONS

This application claims priority to Korean Patent Application No. 10-2018-0110127, filed on Sep. 14, 2018 and Korean Patent Application No. 10-2019-0006151, filed on Jan. 17, 2019, and all the benefits accruing therefrom under 35 U.S.C. § 119, the disclosures of which are incorporated herein by reference in their entirety.

BACKGROUND

1. Field

The present disclosure relates to a semiconductor device.

2. Description of the Related Art

As a scaling technique for increasing the integration density of a semiconductor device, a multi-gate transistor has been suggested in which a fin or nanowire-shape silicon body is formed on a substrate and gates are formed on the surface of the silicon body.

The multi-gate transistor uses a three-dimensional (3D) channel and is thus easy to be scaled up or down. Also, the current control capability of the multi-gate transistor can be improved without increasing the gate length of the multi-gate transistor. Also, a short channel effect (SCE), which is a phenomenon in which the electric potential of a channel region is affected by a drain voltage, can be effectively suppressed.

SUMMARY

Embodiments of the present disclosure provide a semiconductor device which is capable of reducing a short channel effect (SCE) and controlling the amount of current with ease by controlling the width and the number of wire patterns to be stacked.

However, the present invention is not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, there is provided a semiconductor device comprising: a first wire pattern disposed on a substrate and extending in a first direction; a first gate electrode surrounding the first wire pattern and extending in a second direction, the first direction intersecting the second direction perpendicularly; a first transistor including the first wire pattern and the first gate electrode; a second wire pattern disposed on the substrate and extending in the first direction; a second gate electrode surrounding the second wire pattern and extending in the second direction; and a second transistor including the second wire pattern and the second gate electrode, wherein a width of the first wire pattern in the second direction is different from a width of the second wire pattern in the second direction.

According to the aforementioned and other embodiments of the present disclosure, there is provided a semiconductor device comprising: a first wire pattern disposed on a substrate and extending in a first direction; a second wire pattern disposed on the substrate and extending in the first direction, the second wire pattern being spaced apart from the first wire pattern in a second direction, the first direction intersecting the second direction perpendicularly; a third wire pattern disposed on the substrate and extending in the first direction, the third wire pattern being spaced apart from the first wire pattern in the first direction; and a fourth wire pattern disposed on the substrate and extending in the first direction, the fourth wire pattern being spaced apart from the second wire pattern in the first direction and from the third wire pattern in the second direction, wherein the first wire pattern includes a first surface and a second surface opposite to each other in the second direction, the second wire pattern includes a third surface and a fourth surface opposite to each other in the second direction, the third wire pattern includes a fifth surface and a sixth surface opposite to each other in the second direction, the fourth wire pattern includes a seventh surface and a eighth surface opposite to each other in the second direction, a first distance between the first and fourth surfaces is greater than a second distance between the second and third surfaces, a third distance between the fifth and eighth surfaces is greater than a fourth distance between the sixth and seventh surfaces, the first distance is the same as the third distance, and the second distance is different from the fourth distance.

According to the aforementioned and other embodiments of the present disclosure, there is provided a semiconductor device comprising: a first wire pattern disposed on a substrate and extending in a first direction; a first gate electrode surrounding the first wire pattern and extending in a second direction, the second direction intersecting the first direction perpendicularly; a second wire pattern disposed on the substrate and extending in the first direction, the second wire pattern being spaced apart from the first wire pattern in the first direction; a second gate electrode surrounding the second wire pattern and extending in the second direction; a first insulator disposed on the substrate between the first and second wire patterns in a plan view; and a third gate electrode extending in the second direction and disposed on the first insulator, the third gate electrode disposed between the first and second gate electrodes, wherein a width of the first wire pattern in the second direction is different from a width of the second wire pattern in the second direction.

Other features and embodiments may be apparent from the following detailed description, the drawings, and the claims.

BRIEF DESCRIPTION OF THE DRAWINGS

The above and other embodiments and features of the present disclosure will become more apparent by describing the embodiments in detail with reference to the attached drawings, in which.

DETAILED DESCRIPTION

A semiconductor device according to some embodiments of the present disclosure will hereinafter be described with reference to FIGS. 1 through 3.

Figure 1:
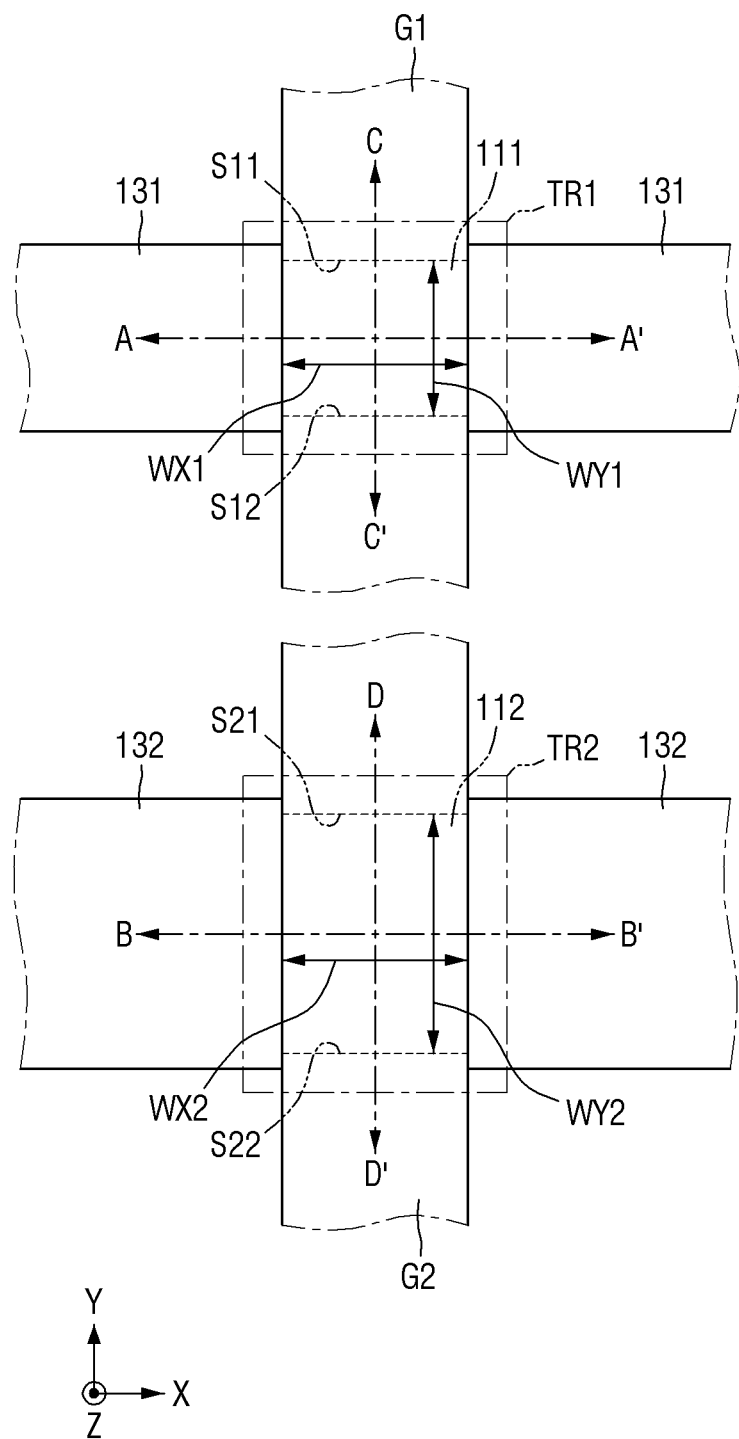
FIG. 1 is a layout view of a semiconductor device according to some embodiments of the present disclosure.

FIG. 1 is a layout view of a semiconductor device according to some embodiments of the present disclosure. FIG. 2 is a cross-sectional view taken along lines A-A' and B-B' of FIG. 1. FIG. 3 is a cross-sectional view taken along lines C-C' and D-D' of FIG. 1.

Figure 2:
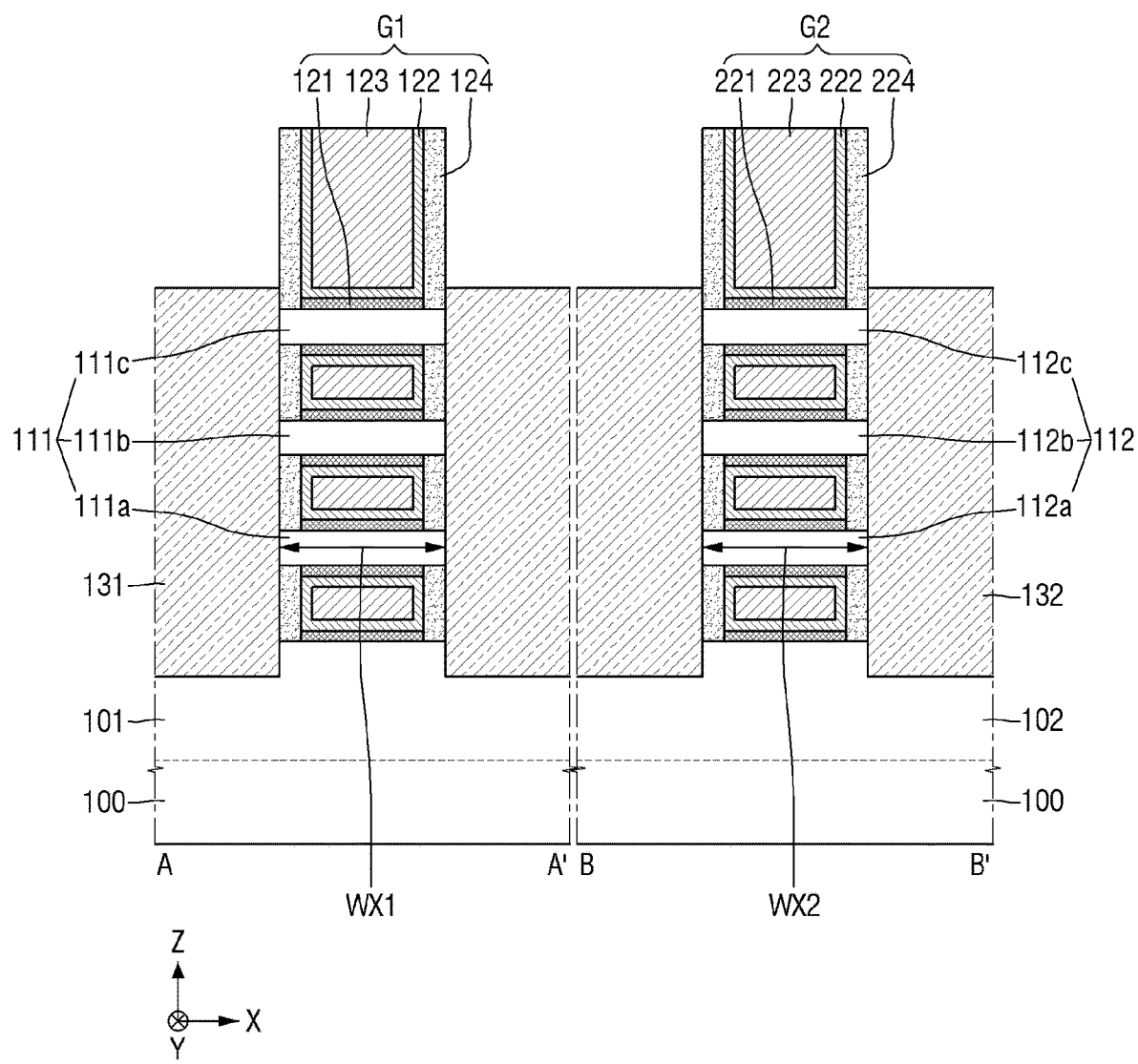
FIG. 2 is a cross-sectional view taken along lines A-A' and B-B' of FIG. 1 according to an embodiment of the disclosure.
Figure 3:
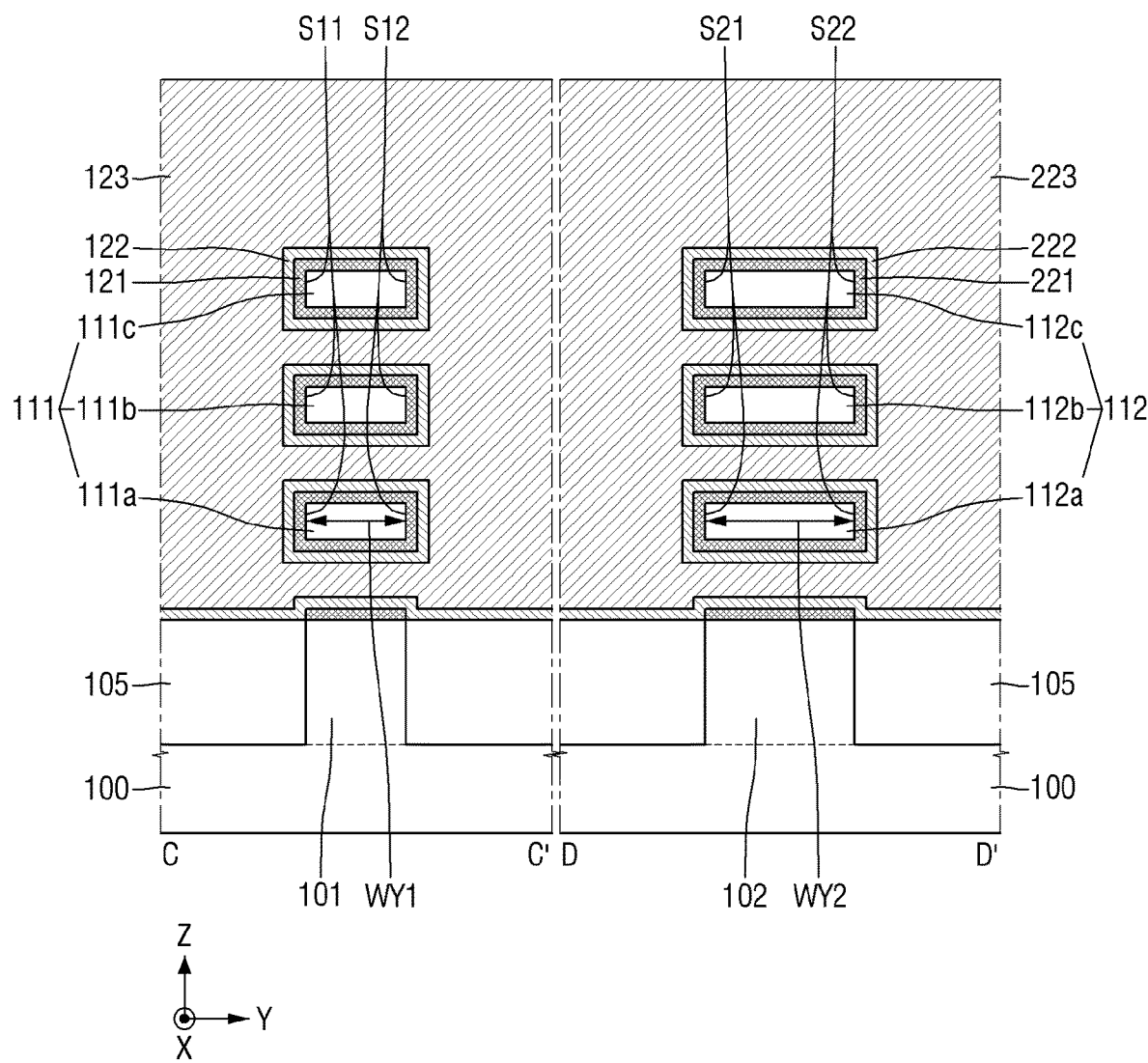
FIG. 3 is a cross-sectional view taken along lines C-C' and D-D' of FIG. 1 according to an embodiment of the disclosure.

Referring to FIGS. 1 through 3, the semiconductor device according to some embodiments of the present disclosure may include first and second transistors TR1 and TR2 formed on a substrate 100.

The substrate 100 may be, for example, a bulk silicon or silicon-on-insulator (SOI) substrate. For example, the substrate 100 may be a silicon substrate or may comprise other materials such as, for example, silicon germanium, indium antimonide, a lead tellurium compound, indium arsenide, indium phosphide, gallium arsenide, or gallium antimonide. In certain embodiments, the substrate 100 may be a base substrate having an epitaxial layer formed thereon.

First and second fin-type patterns 101 and 102 may protrude from the substrate 100. The first and second fin-type patterns 101 and 102 may extend in a first direction X.

The first and second fin-type patterns 101 and 102 may be disposed on the substrate 100 to be spaced apart from each other.

The first and second fin-type patterns 101 and 102 may be formed by etching parts of the substrate 100 or may include an epitaxial layer grown from the substrate 100. The first and second fin-type patterns 101 and 102 may be formed of, for example, an element semiconductor material such as silicon (Si) or germanium (Ge). Alternatively, the first and second fin-type patterns 101 and 102 may include a compound semiconductor such as, for example, a group IV-IV compound semiconductor or a group III-V compound semiconductor.

For example, the first and second fin-type patterns 101 and 102 may include a group IV-IV compound semiconductor such as a binary or ternary compound including at least two of carbon (C), Si, Ge, and tin (Sn), or a compound obtained by doping the binary or ternary compound with a group IV element.

For example, the first and second fin-type patterns 101 and 102 may include a group III-V compound semiconductor such as a binary, ternary, or quaternary compound obtained by combining at least one group III element such as aluminum (Al), gallium (Ga), and indium (In) with a group V element such as phosphorus (P), arsenic (As), and antimony (Sb).

The example first and second fin-type patterns 101 and 102 will hereinafter be described as structures including Si.

A field insulating film 105 may surround at least some parts of the sidewalls of each of the first and second fin-type patterns 101 and 102. The first and second fin-type patterns 101 and 102 may be defined by the field insulating film 105.

The field insulating film 105 may be formed of, for example, an oxide film, a nitride film, an oxynitride film, or may include a combination thereof.

FIG. 3 illustrates that the sidewalls of each of the first and second fin-type patterns 101 and 102 are surrounded entirely by the field insulating film 105, but the present disclosure is not limited thereto.

A plurality of first wire patterns 111 and a plurality of second wire patterns 112 may be disposed above the substrate 100 to be spaced apart from the substrate 100. For example, the first wire patterns 111 and the second wire patterns 112 may be formed on the substrate 100 with one or more other layers disposed therebetween. The term "above" may be used in similar arrangements throughout the disclosure. The first wire patterns 111 and the second wire patterns 112 may extend in the first direction X. The first wire patterns 111 may be spaced apart from the second wire patterns 112 over the substrate 100.

For example, the first wire patterns 111 may be disposed above the first fin-type pattern 101 to be spaced apart from the first fin-type pattern 101. The first wire patterns 111 may overlap with the first fin-type pattern 101 in a third direction Z. For example, the second wire patterns 112 may be disposed above the second fin-type pattern 102 to be spaced apart from the second fin-type pattern 102. The second wire patterns 112 may overlap with the second fin-type pattern 102 in the third direction Z.

Here, a second direction Y and the third direction Z may be directions perpendicularly intersecting the first direction X. For example, the first, second and third directions X, Y and Z may be perpendicular to one another. For example, the third direction Z may be a direction substantially perpendicular to the top surface of the substrate 100.

Each of the first wire patterns 111 may include first and second surfaces S11 and S12 that are opposite to each other in the second direction Y. Each of the second wire patterns 112 may include first and second surfaces S21 and S22 that are opposite to each other in the second direction Y.

The first wire patterns 111 may include, for example, three wire patterns, i.e., first, second, and third first-wire patterns 111a, 111b, and 111c. The first, second, and third first-wire patterns 111a, 111b, and 111c may be disposed to be spaced apart from one another in the third direction Z. The second wire patterns 112 may include, for example, three wire patterns, i.e., first, second, and third second-wire patterns 112a, 112b, and 112c. The first, second, and third second-wire pattern 112a, 112b, and 112c of the second wire patterns 112 may be disposed to be spaced apart from one another in the third direction Z.

The first, second, and third first-wire patterns 111a, 111b, and 111c of the first wire patterns 111 may have a width WX1 in the first direction X. The first, second, and third second-wire patterns 112a, 112b, and 112c of the second wire patterns 112 may have a width WX2 in the first direction X. The widths WX1 and WX2 may be as measured in the first direction X.

In some embodiments, the widths WX1 and WX2 may be substantially the same.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The first, second, and third first-wire patterns 111a, 111b, and 111c may have a width WY1 in the second direction Y. The first, second, and third second-wire patterns 112a, 112b, and 112c may have a width WY2 in the second direction Y. The widths WY1 and WY2 may be as measured in the second direction Y.

In some embodiments, the widths WY1 and WY2 may differ from each other. For example, the width WY2 may be greater than the width WY1. For example, the first wire patterns 111 and the second wire patterns 112 may have the same width in the first direction X, but may have different widths in the second direction Y.

The semiconductor device according to some embodiments may improve a short channel effect (SCE) and may be beneficial to control the amount of current by varying the widths, in the second direction Y, of the first wire patterns 111 and the second wire patterns 112 while fixing the widths, in the first direction X, of the first wire patterns 111 and the second wire patterns 112.

For example, in the case of controlling the amount of current by varying the widths, in the first direction X, of the first wire patterns 111 and the second wire patterns 112 while fixing the widths, in the second direction Y, of the first wire patterns 111 and the second wire patterns 112, the length of a channel may decrease, and as a result, the probability of the occurrence of an SCE may increase. Also, in the case of controlling the amount of current by varying the widths, in the first direction X, of the first wire patterns 111 and the second wire patterns 112 while fixing the widths, in the second direction Y, of the first wire patterns 111 and the second wire patterns 112, as the length of a channel decreases, a turn-on current of a corresponding transistor may converge on a predetermined value.

On the other hand, in the case of controlling the amount of current by varying, in the second direction Y, the widths of the first wire patterns 111 and the second wire patterns 112 while fixing the widths, in the first direction X, of the first wire patterns 111 and the second wire patterns 112, the length of a channel may be secured, and thus, the probability of the occurrence of an SCE may decrease. Also, in the case of controlling the amount of current by varying, in the second direction Y, the widths of the first wire patterns 111 and the second wire patterns 112 while fixing, in the first direction X, the widths of the first wire patterns 111 and the second wire patterns 112, as the length of a channel can be secured, the convergence of a current on a predetermined value may be prevented.

In some embodiments, the number of first wire patterns 111 may be the same as the number of second wire patterns 112. For example, the first, second, and third first-wire patterns 111a, 111b, and 111c may all be in contact with first source/drain regions 131, and the first, second, and third second-wire patterns 112a, 112b, and 112c may all be in contact with second source/drain regions 132.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). [Alt: The term "contact," as used herein, refers to a direct connection (i.e., touching) unless the context indicates otherwise.]

FIGS. 2 and 3 illustrate that the first wire patterns 111 and the second wire patterns 112 both include three wire patterns, but the present disclosure is not limited thereto. For example, the first wire patterns 111 and the second wire patterns 112 may include more than three, or less than three, wire patterns as necessary.

FIG. 3 illustrates that the first wire patterns 111 and the second wire patterns 112 have a rectangular cross-sectional shape, but the present disclosure is not limited thereto. The first wire patterns 111 and the second wire patterns 112 may be subjected to a trimming process to have rounded corners. In certain embodiments, the first and second wire patterns 111 and 112 may be formed to have rounded corners in a cross-sectional view even though the first and second wire patterns 111 and 112 are formed without an additional trimming process.

The first wire patterns 111 may be used as a channel region of the first transistor TR1, and the second wire patterns 112 may be used as a channel region of the second transistor TR2.

The first wire patterns 111 may include the same material as, or a different material from, the first fin-type pattern 101, and the second wire patterns 112 may include the same material as, or a different material from, the second fin-type pattern 102. For convenience, the first wire patterns 111 and the second wire patterns 112 will hereinafter be described as both being formed of Si.

A first gate structure G1 may be disposed to overlap with the first wire patterns 111 in the third direction Z. The first gate structure G1 may be disposed above the field insulating film 105 and the first fin-type pattern 101. A second gate structure G2 may be disposed to overlap with the second wire patterns 112 in the third direction Z. The second gate structure G2 may be disposed above the field insulating film 105 and the second fin-type pattern 102. The first and second gate structures G1 and G2 may extend in the second direction Y.

The first gate structure G1 may include a first gate insulating film, a first gate electrode 123, and first gate spacers 124. The first gate insulating film may include first interface films 121 and first high dielectric constant insulating films 122. The second gate structure G2 may include a second gate insulating film, a second gate electrode 223, and second gate spacers 224. The second gate insulating film may include second interface films 221 and second high dielectric constant insulating films 222.

The first gate electrode 123 may surround the first wire patterns 111, which are spaced apart from the top surface of the first fin pattern 101. For example, the first gate electrode 123 may surround upper and side portions of the first wire patterns 111. The first gate electrode 123 may also be disposed in a space between the first wire patterns 111 and the first fin-type pattern 101. The second gate electrode 223 may surround the second wire patterns 112, which are spaced apart from the top surface of the second fin-type pattern 102. For example the second gate electrode 223 may surround upper and side portions of the second wire patterns 112. The second gate electrode 223 may also be disposed in a space between the second wire patterns 112 and the second fin-type pattern 102.

The first and second gate electrodes 123 and 223 may include a conductive material. The first and second gate electrodes 123 and 223 are illustrated as being single-layer films, but the present disclosure is not limited thereto. For example, each of the first and second gate electrodes 123 and 223 may include a work function conductive layer controlling a work function and a filling conductive layer filling a space formed by the work function conductive layer. In certain embodiments, the first and second gate electrodes 123 and 223 may be electrically connected to each other. For example, the first and second gate electrodes 123 and 223 may be directly connected in the second direction, e.g., though a gate line integrally formed with the first and second gate electrodes 123 and 223.

The first and second gate electrodes 123 and 223 may include, for example, at least one of TiN, WN, TaN, Ru, TiC, TaC, Ti, Ag, Al, TiAl, TiAlN, TiAlC, TaCN, TaSiN, Mn, Zr, W, and Al. In certain embodiments, the first and second gate electrodes 123 and 223 may be formed of Si or SiGe, rather than being formed of a metal. The first and second gate electrodes 123 and 223 may be formed by, for example, a replacement process, but the present disclosure is not limited thereto. For example, the replacement process may include forming dummy gate electrodes and forming the first and second gate electrodes 123 and 223 in the corresponding places after removing the dummy gate electrodes.

The first spacers 124 may be disposed on at least one sidewall of the first gate electrode 123, and the second spacers 224 may be disposed on at least one sidewall of the second gate electrode 224. The first spacers 124 may surround at least some of the first wires 111, and the second spacers 224 may surround at least some of the second wires 112. For example, each of the first wires 111 may penetrate the first gate spacers 124, and each of the second wire patterns 112 may penetrate the second gate spacers 224.

Parts of the first gate spacers 124 disposed on the third first-wire pattern 111c and parts of the second gate spacers 224 disposed on the third second-wire pattern 112c may include, for example, at least one of silicon nitride (SiN), silicon oxynitride (SiON), silicon oxide ($SiO_2$), silicon oxycarbonitride (SiOCN), and a combination thereof.

Parts of the first gate spacers 124 disposed between the third first-wire pattern 111c and the second first-wire pattern 111b, between the second first-wire pattern 111b and the first first-wire pattern 111a, and between the first first-wire pattern 111a and the first fin-type pattern 101 and parts of the second gate spacers 224 disposed between the third first-wire pattern 112c and the second first-wire pattern 112b, between the second second-wire pattern 112b and the first second-wire pattern 112a, and between the first second-wire pattern 112a and the second fin-type pattern 102 may include, for example, at least one of a low dielectric constant dielectric material, silicon nitride, silicon oxynitride, silicon oxide, silicon oxycarbonitride, and a combination thereof. The low dielectric constant dielectric material may have a smaller dielectric constant than silicon oxide.

The first interface films 121 may be disposed around each of the first wire patterns 111. The first interface films 121 may be disposed on the top surface of the first fin-type pattern 101. The second interface films 221 may be disposed around each of the second wire patterns 112. The second interface films 221 may be disposed on the top surface of the second fin-type pattern 102.

In a case where the first wire patterns 111 and the second wire patterns 112 include silicon, the first interface films 121 and the second interface films 221 may include silicon oxide films. The first interface films 121 may be disposed around each of the first wire patterns 111 and on the top surface of the first fin-type pattern 101, but not on the sidewalls of the first gate spacers 124, and the second interface films 221 may be disposed around each of the second wire patterns 112 and on the top surface of the second fin-type pattern 102, but not on the sidewalls of the second gate spacers 424.

The first high dielectric constant insulating films 122 may be disposed between the first interface films 121 and the first gate electrode 123. The first high dielectric constant insulating films 122 may be disposed along the top surfaces of the field insulating film 105 and the first fin-type pattern 101. The second high dielectric constant insulating films 222 may be disposed between the second interface films 221 and the second gate electrode 223. The second high dielectric constant insulating films 222 may be disposed along the top surfaces of the field insulating film 105 and the second fin-type pattern 102.

The first high dielectric constant insulating films 122 and the second high dielectric constant insulating films 222 may include a high dielectric constant material having a greater dielectric constant than silicon oxide. For example, the high dielectric constant material may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but the present disclosure is not limited thereto.

The first interface films 121 and the second interface films 221 may not be provided depending on the materials of the first wire patterns 111 and the second wire patterns 112. When the first interface films 121 and the second interface films 221 are not provided, the first high dielectric constant insulating films 122 and the second high dielectric constant insulating films 222 may include not only the aforementioned high dielectric constant material, but also silicon oxide films, silicon oxynitride films, or silicon nitride films.

The first source/drain regions 131 may be disposed on at least one side of the first gate structure G1, and the second source/drain regions 132 may be disposed on at least one side of the second gate structure G2. The first source/drain regions 131 may be disposed on the first fin-type pattern 101, and the second source/drain regions 132 may be disposed on the second fin-type pattern 102. The first source/drain regions 131 may include an epitaxial layer formed on the top surface of the first fin-type pattern 101, and the second source/drain regions 132 may include an epitaxial layer formed on the top surface of the second fin-type pattern 102.

The first source/drain regions 131 may be directly connected to the first wire patterns 111 which are used as a channel region in the first transistor TR1, and the second source/drain regions 132 may be directly connected to the second wire patterns 112 which are used as a channel region in the second transistor TR2.

The first transistor TR1 may include the first gate structure G1, the first wire patterns 111, and the first source/drain regions 131. The second transistor TR2 may include the second gate structure G2, the second wire patterns 112, and the second source/drain regions 132.

In some embodiments, the first and second transistors TR1 and TR2 may be of the same type. For example, the same type transistors may include the same electrical polarity of impurities in the components of the transistors including channel areas and/or source/drain areas.

In some embodiments, the first and second transistors TR1 and TR2 may be of different types. For example, the different types of transistors may include opposite electrical polarity of impurities in the components of the transistors including channel areas and/or source/drain areas. For example, the different types of transistors may include different electrical polarities from each other. For example, the first and second transistors TR1 and TR2 may be formed in different regions of the substrate 100. For example, the first and second gate structures G1 and G2 of the first and second transistors TR1 and TR2 may be connected to each other to form a complementary metal oxide semiconductor (CMOS).

In some embodiments, the first transistor TR1 may be formed in a logic region (e.g., a region where logic circuits are formed), and the second transistor TR2 may be formed in a static random access memory (SRAM) forming region.

Since the first wire patterns 111 and the second wire patterns 112 have different widths (i.e., the widths WY1 and WY2) in the second direction Y, the first and second transistors TR1 and TR2 may be used for different purposes. For example, since the width WY2 of the second wire patterns 112 is greater than the width WY1 of the first wire patterns 111, the first transistor TR1 may be used in situations where low power consumption is beneficial, and the second transistor TR2 may be used in situations where high performance is beneficial.

A semiconductor device according to some embodiments of the present disclosure will hereinafter be described with reference to FIGS. 1, 3, and 4. For brevity, descriptions of elements or features that have already been described above may be omitted or simplified.

Figure 4:
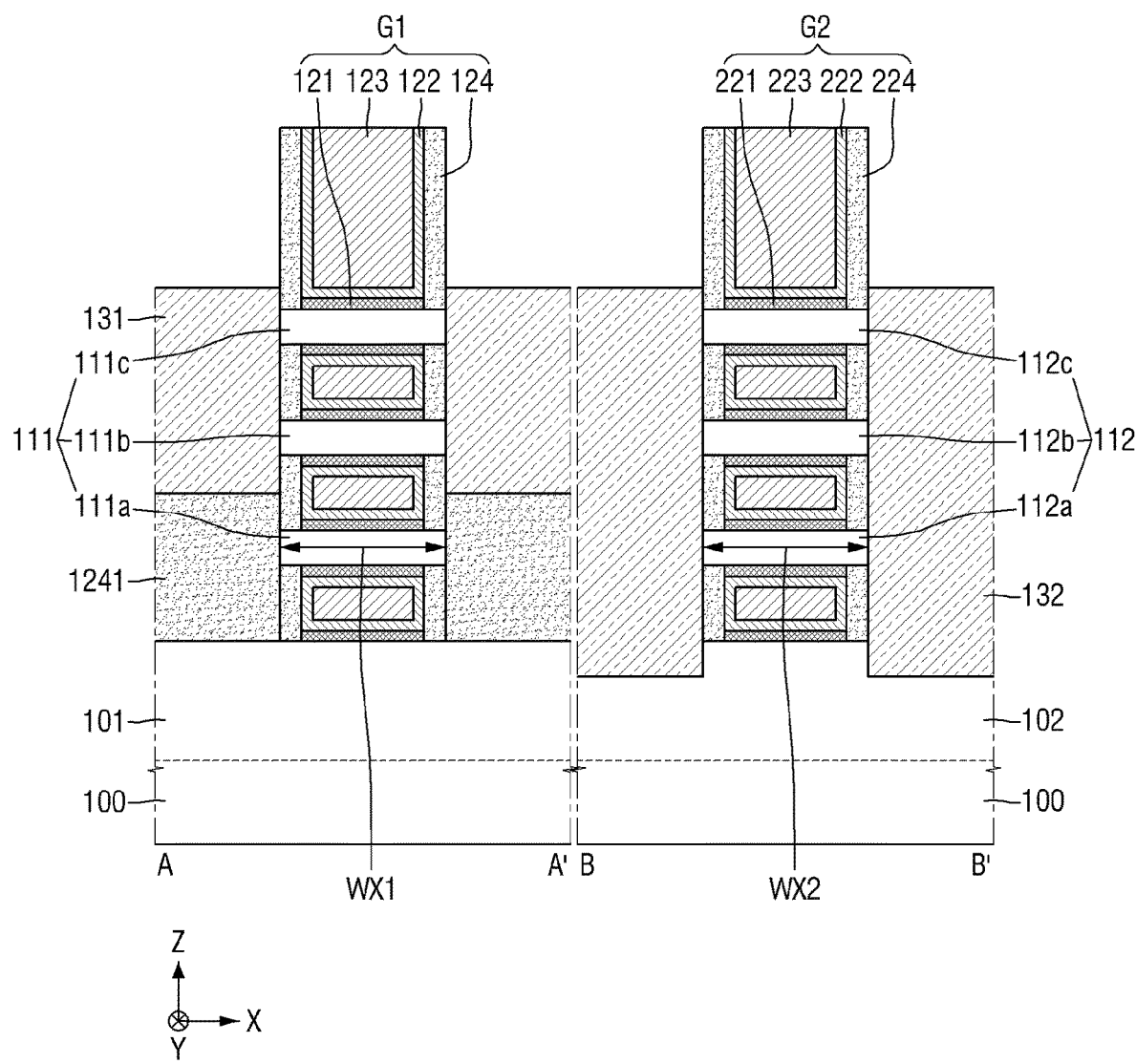
FIG. 4 is a cross-sectional view taken along lines A-A' and B-B' of FIG. 1 according to an embodiment of the disclosure.

FIG. 4 is a cross-sectional view taken along lines A-A' and B-B' of FIG. 1.

Referring to FIGS. 1, 3, and 4, the semiconductor device according to some embodiments of the present disclosure may further include a spacer material 1241.

The spacer material 1241 may be disposed between the first source/drain regions 131 and the first fin-type pattern 101. For example, the first first-wire pattern 111a may not be directly connected to the first source/drain regions 131, but may be directly connected to the spacer material 1241. For example, the first first-wire pattern 111a may not be used as the channel region of the first transistor TR1.

The first transistor TR1 may use the second and third first-wire patterns 111b and 111c as its channel region, and the second transistor TR2 may use all the second wire patterns 112 as its channel region.

The spacer material 1241 may be the same as the material of the first gate spacers 124. For example, the spacer material 1241 may include an insulating material.

The semiconductor device according to some embodiments of the present disclosure may control the amount of current in each of the first and second transistors TR1 and TR2 by controlling the number of wire patterns used as the channel region of each of the first and second transistors TR1 and TR2. Also, as already mentioned above, since the width WY1 of the first wire patterns 111 and the width WY2 of the second wire patterns 112 are different, the amount of current in each of the first and second transistors TR1 and TR2 may be properly controlled/adjusted.

A semiconductor device according to some embodiments of the present disclosure will hereinafter be described with reference to FIGS. 1, 5, and 6. For brevity, descriptions of elements or features that have already been described above may be omitted or simplified.

Figure 5:
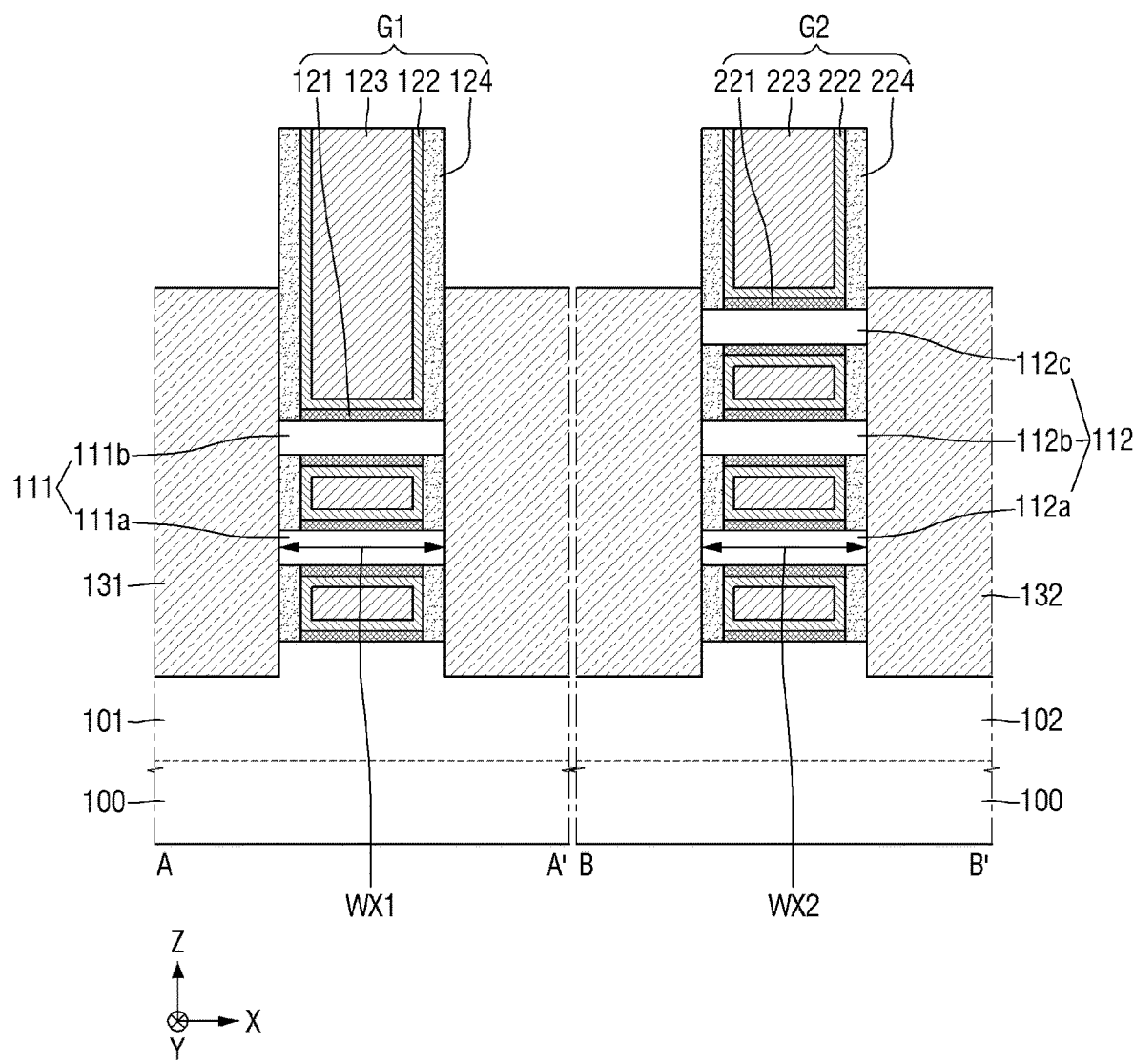
FIG. 5 is a cross-sectional view taken along lines A-A' and B-B' of FIG. 1 according to an embodiment of the disclosure.

FIG. 5 is a cross-sectional view taken along lines A-A' and B-B' of FIG. 1. FIG. 6 is a cross-sectional view taken along lines C-C' and D-D' of FIG. 1.

Figure 6:
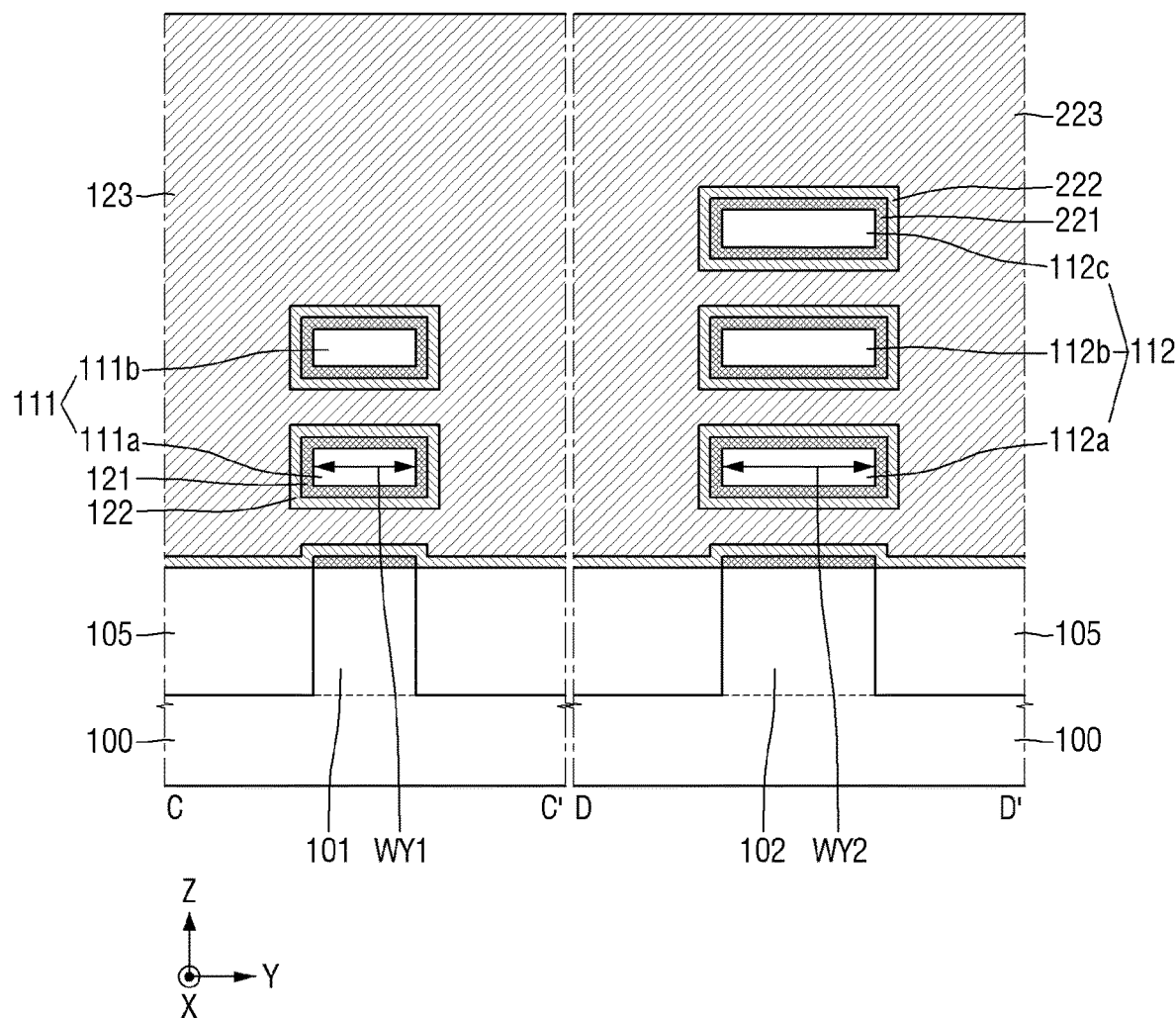
FIG. 6 is a cross-sectional view taken along lines C-C' and D-D' of FIG. 1 according to an embodiment of the disclosure.

Referring to FIGS. 1, 5, and 6, the number of first wire patterns 111 may be different from the number of second wire patterns 112.

Accordingly, the number of wire patterns used as the channel region of a first transistor TR1 may be different from the number of wire patterns used as the channel region of a second transistor TR2. As a result, the amount of current in each of the first and second transistors TR1 and TR2 may be properly controlled/adjusted. Also, as already mentioned above, since a width WY1, in the second direction Y, of the first wire patterns 111 and a width WY2, in the second direction Y, of the second wire patterns 112 are different, the amount of current in each of the first and second transistors TR1 and TR2 may be properly controlled/adjusted.

A semiconductor device according to some embodiments of the present disclosure will hereinafter be described with reference to FIGS. 7 through 10. For brevity, descriptions of elements or features that have already been described above may be omitted or simplified.

Figure 7:
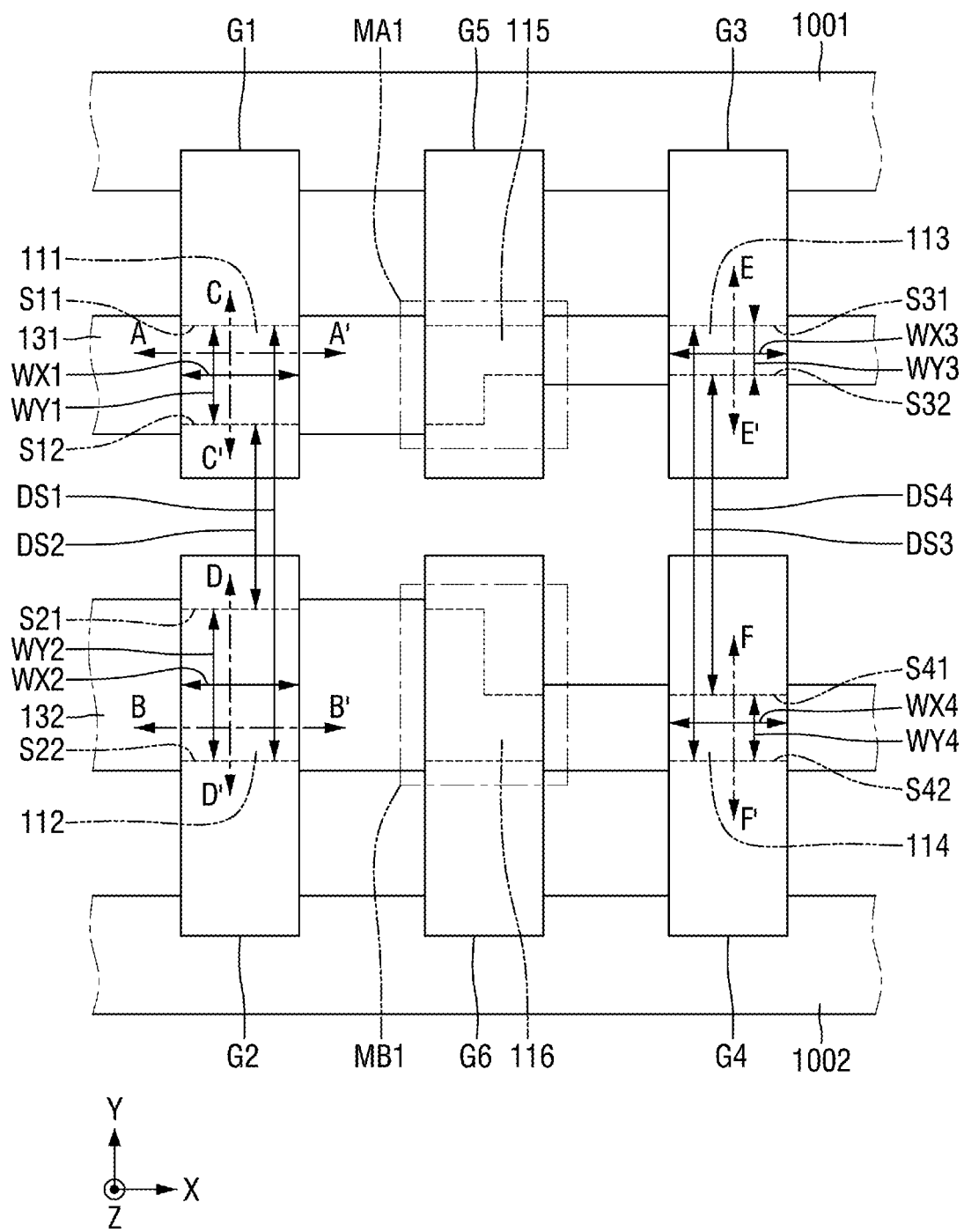
FIG. 7 is a layout view of a semiconductor device according to some embodiments of the present disclosure.
Figure 8:
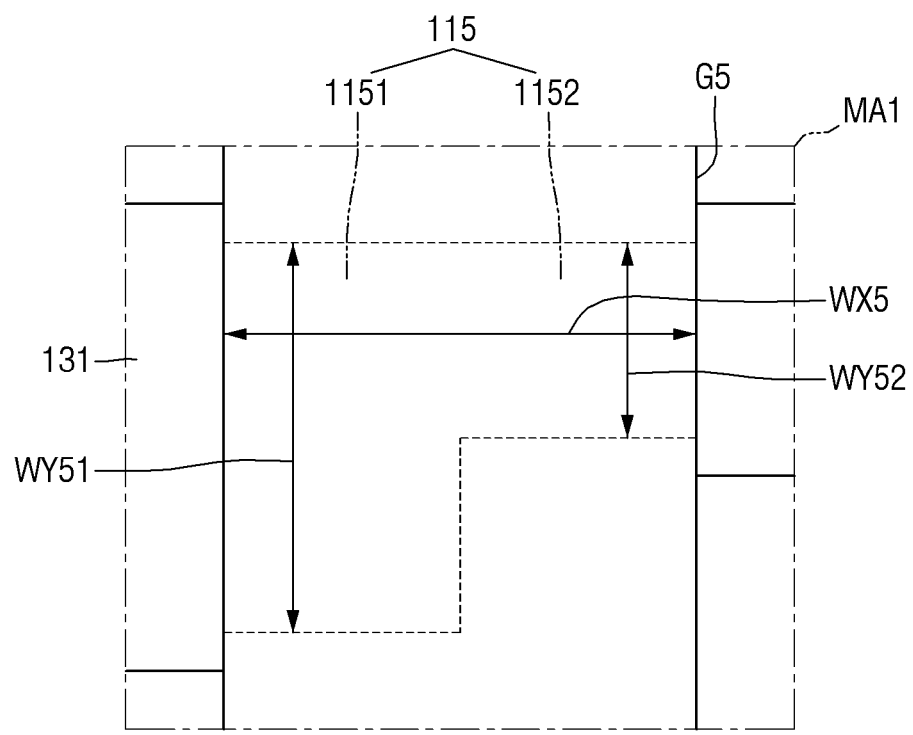
FIG. 8 is an enlarged view illustrating an area MA1 of FIG. 7.
Figure 9:
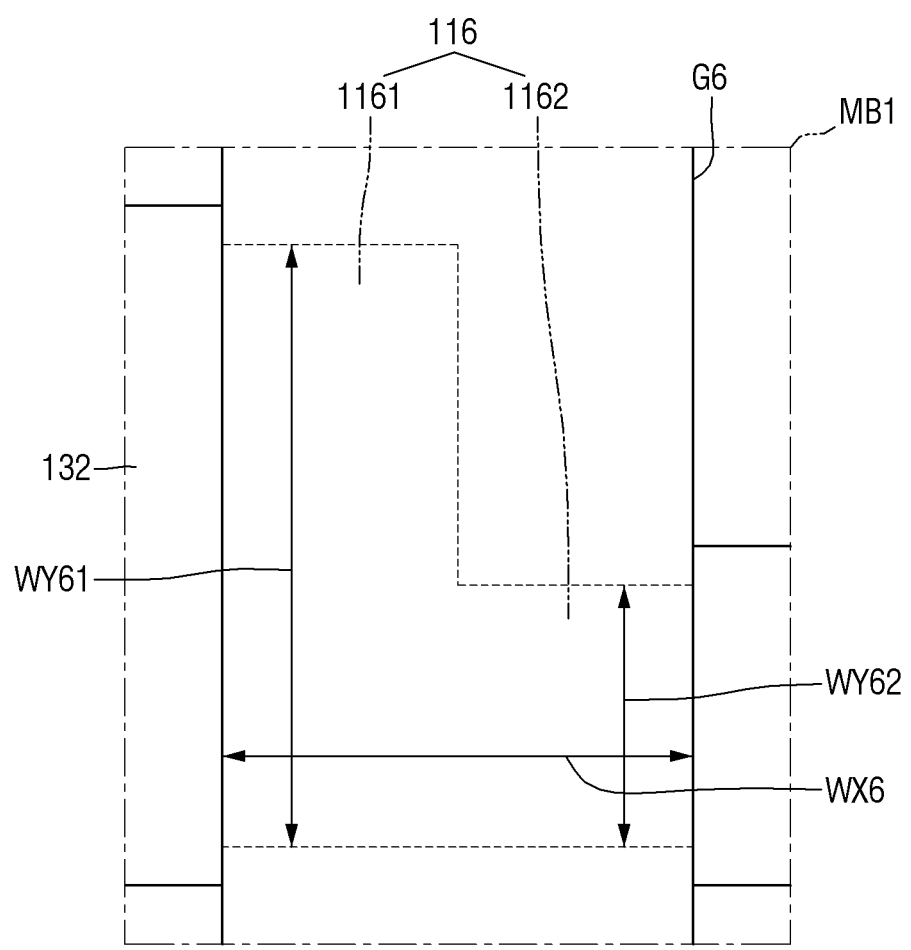
FIG. 9 is an enlarged view illustrating an area MB1 of FIG. 7.
Figure 10:
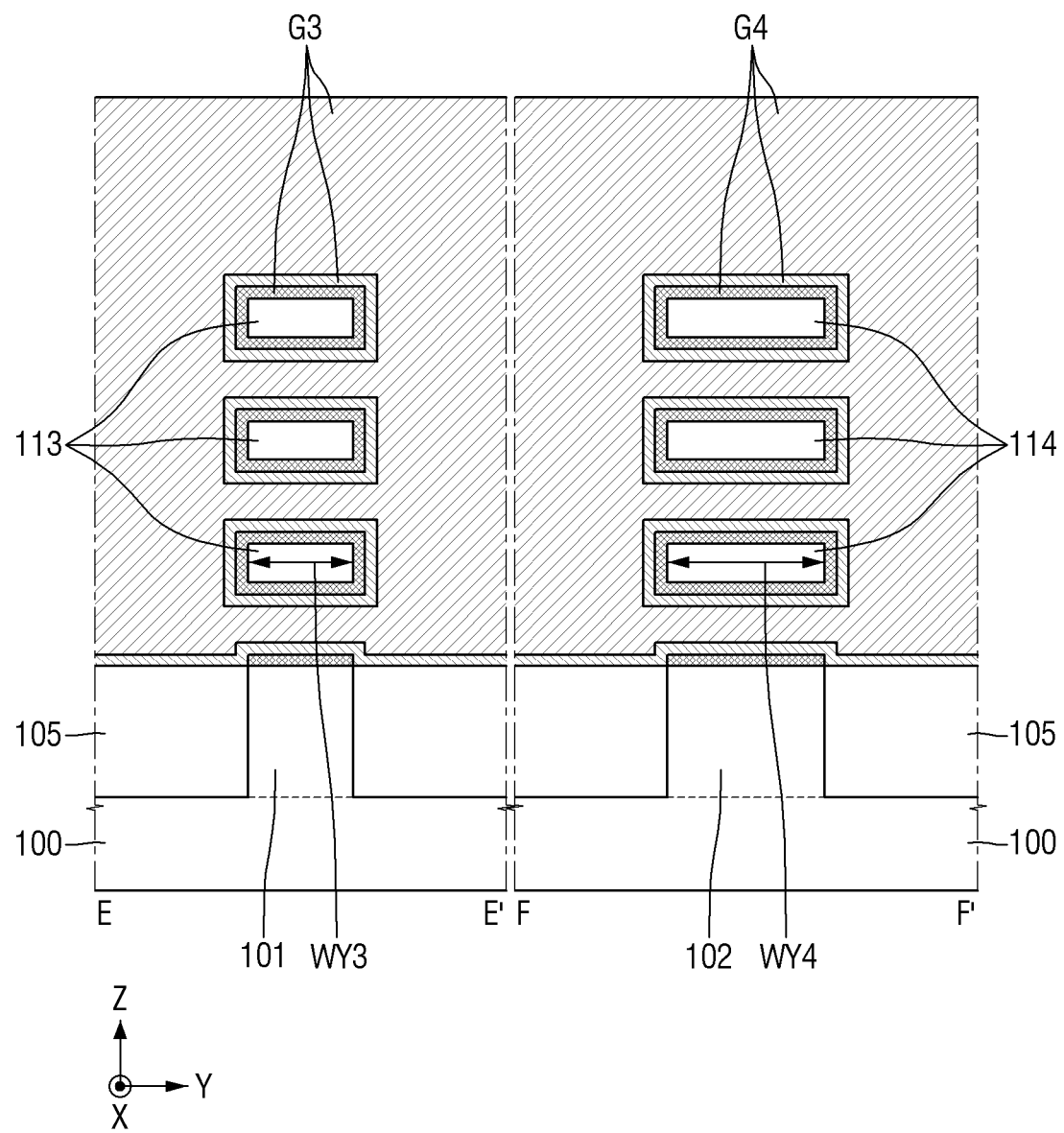
FIG. 10 is a cross-sectional view taken along lines E-E' and F-F' of FIG. 7.

FIG. 7 is a layout view of a semiconductor device according to some embodiments of the present disclosure. FIG. 8 is an enlarged view illustrating an area MA1 of FIG. 7. FIG. 9 is an enlarged view illustrating an area MB1 of FIG. 7. FIG. 10 is a cross-sectional view taken along lines E-E' and F-F' of FIG. 7.

Referring to FIGS. 7 through 10, the semiconductor device according to some embodiments of the present disclosure may include first and second power rails 1001 and 1002. For example, the first and second power rails 1001 and 1002 may be power supplying rails and may be applied with positive or negative power supply voltages, e.g., Vdd or Vss.

The first and second power rails 1001 and 1002 may extend in a first direction X. The first and second power rails 1001 and 1002 may be spaced apart from each other in a second direction Y. The first power rail 1001 may be disposed on, and overlap with, first ends of first, third, and fifth gate structures G1, G3, and G5. The second power rail 1002 may be disposed on, and overlap with, second ends of second, fourth, and sixth gate structures G2, G4, and G6.

The first, third, and fifth gate structures G1, G3, and G5 may be disposed between the first and second power rails 1001 and 1002 to be spaced apart from one another in the first direction X. The second, fourth, and sixth gate structures G2, G4, and G6 may be disposed between the first and second power rails 1001 and 1002 to be spaced apart from one another in the first direction X.

The first, third, and fifth gate structures G1, G3, and G5 may be spaced apart from the second, fourth, and sixth gate structures G2, G4, and G6 in the second direction Y.

For example, the first to sixth gate electrodes G1 to G6 may extend to the second direction Y. For example, the first gate electrode G1 and the second gate electrode G2 may overlap with each other in the second direction Y, and the first gate structure G1 may be spaced apart from the second gate structure G2 in the second direction Y. For example, the third gate electrode G3 and the fourth gate electrode G4 may overlap with each other in the second direction Y, and the third gate structure G3 may be spaced apart from the fourth gate structure G4 in the second direction Y. For example, the fifth gate structure G5 and the sixth gate structure G6 may overlap with each other in the second direction Y, and the fifth gate structure G5 may be spaced apart from the sixth gate structure G6 in the second direction Y.

A plurality of first wire patterns 111, a plurality of third wire patterns 113, and a plurality of fifth wire patterns 115 may overlap with the first, third, and fifth gate structures G1, G3, and G5, respectively, in a third direction Z. A plurality of second wire patterns 112, a plurality of fourth wire patterns 114, and a plurality of sixth wire patterns 116 may overlap with the second, fourth, and sixth gate structures G2, G4, and G6, respectively, in the third direction Z.

The first wire patterns 111, the third wire patterns 113, and the fifth wire patterns 115 may be respectively spaced apart from the second wire patterns 112, the fourth wire patterns 114, and the sixth wire patterns 116 in the second direction Y. For example, the first wire patterns 111, the third wire patterns 113, and the fifth wire patterns 115 may respectively overlap with the second wire patterns 112, the fourth wire patterns 114, and the sixth wire patterns 116 in the second direction Y.

The first wire patterns 111, the third wire patterns 113, and the fifth wire patterns 115 may overlap with the first, third, and fifth gate structures G1, G3, and G5, respectively, in the third direction Z. The second wire patterns 112, the fourth wire patterns 114, and the sixth wire patterns 116 may overlap with the second, fourth, and sixth gate structures G2, G4, and G6, respectively, in the third direction Z.

The first wire patterns 111 may respectively have first surfaces S11 and second surfaces S12. The first surfaces S11 and the second surfaces S12 of the first wire patterns 111 may be respectively opposite to each other. The first surfaces S11 of the first wire patterns 111 may face the first power rail 1001 in the second direction Y. For example, the distance between the first power rail 1001 and the first surfaces S11 of the first wire patterns 111 may be smaller than the distance between the first power rail 1001 and second surfaces S12 of the first wire patterns 111. For example, the first surfaces S11 of the first wire patterns 111 may be at the same distance from the first power rail 1001 in a plan view, and the second surfaces S12 of the first wire patterns 111 may be at the same distance from the first power rail 1001 in a plan view.

The second wire patterns 112 may respectively have first surfaces S21 and second surfaces S22. The first surfaces S21 and the second surfaces S22 of the second wire patterns 112 may be respectively opposite to each other. The second surfaces S22 of the second wire patterns 112 may face the second power rail 1002 in the second direction Y. For example, the distance between the second power rail 1002 and the second surfaces S22 of the second wire patterns 112 may be smaller than the distance between the second power rail 1002 and first surfaces S21 of the second wire patterns 112. For example, the first surfaces S21 of the second wire patterns 112 may be at the same distance from the first power rail 1001 in a plan view, and the second surfaces S22 of the second wire patterns 112 may be at the same distance from the first power rail 1001 in a plan view.

The third wire patterns 113 may respectively have first surfaces S31 and second surfaces S32. The first surfaces S31 and the second surfaces S32 of the third wire patterns 113 may be respectively opposite to each other. The first surfaces S31 of the third wire patterns 113 may face the first power rail 1001 in the second direction Y. For example, the distance between the first power rail 1001 and the first surfaces S31 of the third wire patterns 113 may be smaller than the distance between the first power rail 1001 and second surfaces S32 of the third wire patterns 113. For example, the first surfaces S31 of the third wire patterns 113 may be at the same distance from the first power rail 1001 in a plan view, and the second surfaces S32 of the third wire patterns 113 may be at the same distance from the first power rail 1001 in a plan view.

The fourth wire patterns 114 may respectively have first surfaces S41 and second surfaces S42. The first surfaces S41 and the second surfaces S42 of the fourth wire patterns 114 may be respectively opposite to each other. The second surfaces S42 of the fourth wire patterns 114 may face the second power rail 1002 in the second direction Y. For example, the distance between the second power rail 1002 and the second surfaces S42 of the fourth wire patterns 114 may be smaller than the distance between the second power rail 1002 and first surfaces S41 of the fourth wire patterns 114. For example, the first surfaces S41 of the fourth wire patterns 114 may be at the same distance from the first power rail 1001 in a plan view, and the second surfaces S42 of the fourth wire patterns 114 may be at the same distance from the first power rail 1001 in a plan view.

The first surfaces S11 of the first wire patterns 111 and the first surfaces S31 of the third wire patterns 113, which face the first power rail 1001 in the second direction Y, may be located on the same XZ plane. On the other hand, the second surfaces S12 of the first wire patterns 111 and the second surfaces S32 of the third wire patterns 113 may not be located on the same plane. For example, the second surfaces S12 of the first wire patterns 111 and the second surfaces S32 of the third wire patterns 113 may be at different distances from the first power rail 1001 in the second direction Y. For example, the second surfaces S12 of the first wire patterns 111 and the second surfaces S32 of the third wire patterns 113 may be disposed on different XZ planes from each other.

The second surfaces S22 of the second wire patterns 112 and the second surfaces S42 of the fourth wire patterns 114, which face the second power rail 1002 in the second direction Y, may be located on the same XZ plane. For example, the second surfaces S22 of the second wire patterns 112 and the second surfaces S42 of the fourth wire patterns 114 may be at the same distance from the second power rail 1002 in the second direction Y. On the other hand, the first surfaces S21 of the second wire patterns 112 and the first surfaces S41 of the fourth wire patterns 114 may not be located on the same plane. For example, the first surfaces S21 of the second wire patterns 112 and the first surfaces S41 of the fourth wire patterns 114 may be at different distances from the second power rail 1002 in the second direction Y. For example, the first surfaces S21 of the second wire patterns 112 and the first surfaces S41 of the fourth wire patterns 114 may be disposed on different XZ planes from each other.

The distance between the first surfaces S11 of the first wire patterns 111 and the second surfaces S22 of the second wire patterns 112 may be a first distance DS1. The distance between the second surfaces S12 of the first wire patterns 111 and the first surfaces S21 of the second wire patterns 112 may be a second distance DS2. The distance between the first surfaces S31 of the third wire patterns 113 and the second surfaces S42 of the fourth wire patterns 114 may be a third distance DS3. The distance between the second surfaces S32 of the third wire patterns 113 and the first surfaces S41 of the fourth wire patterns 114 may be a fourth distance DS4.

In some embodiments, the second distance DS2 may be smaller than the fourth distance DS4. For example, the first and third distances DS1 and DS3 may be substantially the same. The first distance DS1 may be greater than the second distance DS2. The third distance DS3 may be greater than the fourth distance DS4.

For example, a width WX1, in the first direction X, of the first wire patterns 111, a width WX2, in the first direction X, of the second wire patterns 112, a width WX3, in the first direction X, of the third wire patterns 113, a width WX4, in the first direction X, of the fourth wire patterns 114, a width WX5, in the first direction X, of the fifth wire patterns 115, and a width WX6, in the first direction X, of the sixth wire patterns 116 may be substantially the same.

A width WY1, in the second direction Y, of the first wire patterns 111 may be different from a width WY2, in the second direction Y, of the second wire patterns 112. For example, the width WY1 of the first wire patterns 111 may be smaller than the width WY2 of the second wire patterns 112.

A width WY3, in the second direction Y, of the third wire patterns 113 may be different from a width WY4, in the second direction Y, of the fourth wire patterns 114. For example, the width WY3 of the third wire patterns 113 may be smaller than the width WY4 of the fourth wire patterns 114.

The width WY1 of the first wire patterns 111 may be different from the width WY3 of the third wire patterns 113. For example, the width WY1 of the first wire patterns 111 may be greater than the width WY3 of the third wire patterns 113.

The width WY2 of the second wire patterns 112 may be different from the width WY4 of the fourth wire patterns 114. For example, the width WY2 of the second wire patterns 112 may be greater than the width WY4 of the fourth wire patterns 114.

The fifth wire patterns 115 may include first portions 1151 and second portions 1152, which are parallel/connected to the first portions 1151 in the first direction X. The first portions 1151 of the fifth wire patterns 115 may have a width WY51 in the second direction Y. The second portions 1152 of the fifth wire patterns 115 may have a width WY52 in the second direction Y, and the width WY52 may be smaller than the width WY51. In some embodiments, the width WY51 may be the same as the width WY1, and the width WY52 may be the same as the width WY3.

The sixth wire patterns 116 may include first portions 1161 and second portions 1162, which are parallel/connected to the first portions 1161 in the first direction X. The first portions 1161 of the sixth wire patterns 116 may have a width WY61 in the second direction Y. The second portions 1162 of the sixth wire patterns 116 may have a width WY62 in the second direction Y, and the width WY62 may be smaller than the width WY61. In some embodiments, the width WY61 may be the same as the width WY2, and the width WY62 may be the same as the width WY4.

A first transistor may include the first wire patterns 111 and a first gate structure G1. A second transistor may include the second wire patterns 112 and a second gate structure G2. A third transistor may include the third wire patterns 113 and a third gate structure G3. A fourth transistor may include the fourth wire patterns 114 and a fourth gate structure G4. A fifth transistor may include the fifth wire patterns 115 and a fifth gate structure G5. A sixth transistor may include the sixth wire patterns 116 and a sixth gate structure G6. For example, the fifth transistor may be disposed between the first and third transistors in the first direction X, and the sixth transistor may be disposed between the second and fourth transistors in the first direction X.

In some embodiments, the first, third, and fifth transistors may be of the same type, and the second, fourth, and sixth transistors may be of the same type and may also be of the same type as the first, third, and fifth transistors. For example, all of the first to sixth transistors may be PMOS transistors or all of the first to sixth transistors may be NMOS transistors.

In some embodiments, the first, third, and fifth transistors may be of the same type, and the second, fourth, and sixth transistors may be of the same type, but may be of a different type from the first, third, and fifth transistors. For example, the different types of transistors may include opposite electrical polarity of impurities in the components of the transistors including channel areas and/or source/drain areas. On the other hand, the same type transistors may include the same electrical polarity of impurities in the components of the transistors including channel areas and/or source/drain areas.

A cross-sectional view, taken along the first direction X, of the third wire patterns 113 and the third gate structure G3 may be substantially the same as a cross-sectional view, taken along the first direction X (i.e., along line A-A'), of the first wire patterns 111 and the first gate structure G1.

A cross-sectional view, taken along the first direction X, of the fourth wire patterns 114 and the fourth gate structure G4 may be substantially the same as a cross-sectional view, taken along line B-B', of the second wire patterns 112 and the second gate structure G2.

A cross-sectional view, taken along the first direction X, of the fifth wire patterns 115 and the fifth gate structure G5 may be substantially the same as a cross-sectional view, taken along line A-A', of the first wire patterns 111 and the first gate structure G1. A cross-sectional view, taken along the second direction Y, of the first portions 1151 of the fifth wire patterns 115 and the fifth gate structure G5 may be substantially the same as a cross-sectional view, taken along line C-C', of the first wire patterns 111 and the first gate structure G1. A cross-sectional view, taken along the second direction Y, of the second portions 1152 of the fifth wire patterns 115 and the fifth gate structure G5 may be substantially the same as a cross-sectional view, taken along line E-E', of the third wire patterns 113 and the third gate structure G3.

A cross-sectional view, taken along the first direction X, of the sixth wire patterns 116 and the sixth gate structure G6 may be substantially the same as a cross-sectional view, taken along the first direction X (i.e., along line B-B'), of the second wire patterns 112 and the second gate structure G2. A cross-sectional view, taken along the second direction Y, of the first portions 1161 of the sixth wire patterns 116 and the sixth gate structure G6 may be substantially the same as a cross-sectional view, taken along the second direction Y (i.e., along line D-D'), of the second wire patterns 112 and the second gate structure G2. A cross-sectional view, taken along the second direction Y, of the second portions 1162 of the sixth wire patterns 116 and the sixth gate structure G6 may be substantially the same as a cross-sectional view, taken along the second direction Y (i.e., along line F-F'), of the fourth wire patterns 114 and the fourth gate structure G4.

A semiconductor device according to some embodiments of the present disclosure will hereinafter be described with reference to FIGS. 11 and 12. For brevity, descriptions of elements or features that have already been described above may be omitted or simplified.

Figure 11:
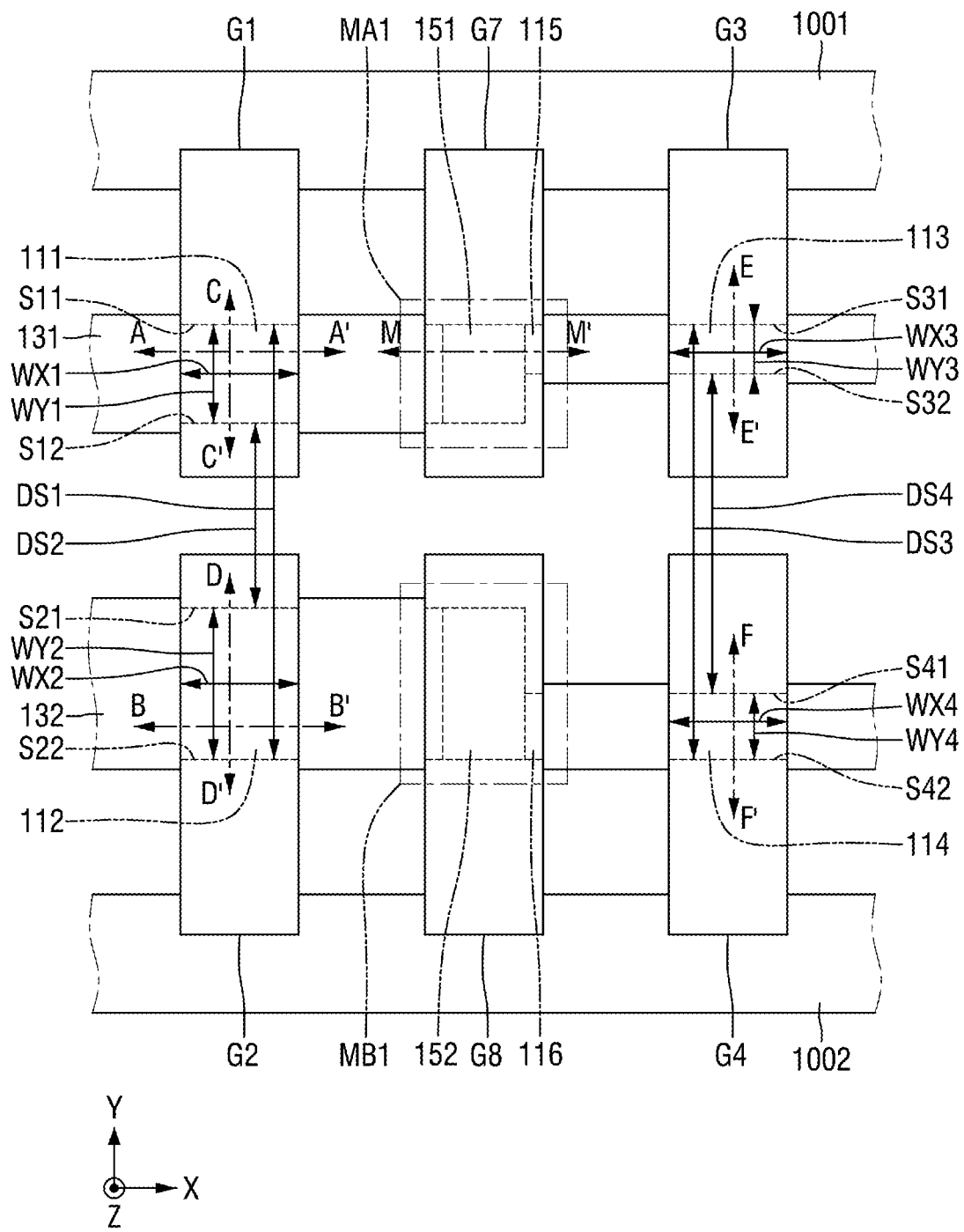
FIG. 11 is a layout view of a semiconductor device according to some embodiments of the present disclosure.

FIG. 11 a layout view of a semiconductor device according to some embodiments of the present disclosure. FIG. 12 is a cross-sectional view taken along line M-M' of FIG. 11.

Figure 12:
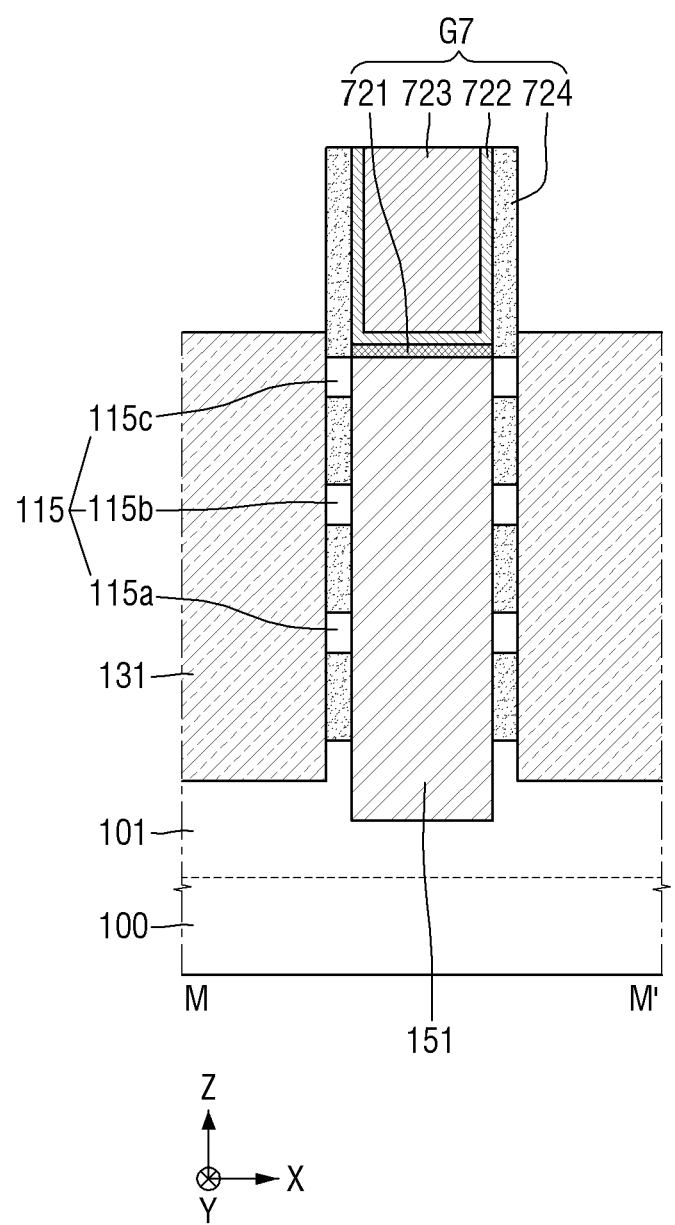
FIG. 12 is a cross-sectional view taken along line M-M' of FIG. 11.

Referring to FIGS. 11 and 12, the semiconductor device according to some embodiments of the present disclosure may include first and second insulators 151 and 152.

The first insulator 151 may be disposed between a plurality of first wire patterns 111 and a plurality of third wire patterns 113, e.g., in the first direction X and/or in a plan view. The first insulator 151 may be formed in an area where some of a plurality of fifth wire patterns 115 are removed. For example, the first insulator 151 may be formed in an area corresponding to the plurality of fifth wire patterns 115 in the previous embodiment. A part of the first insulator 151 may be disposed in a first fin-type pattern 101. The first insulator 151 may extend, along a third direction Z, from the first fin-type pattern 101 to a seventh gate structure G7.

The second insulator 152 may be disposed between a plurality of second wire patterns 112 and a plurality of fourth wire patterns 114, e.g., in the first direction and/or in a plan view. The second insulator 152 may be formed in an area where some of a plurality of sixth wire patterns 116 are removed. For example, the second insulator 152 may be formed in an area corresponding to the plurality of sixth wire patterns 116 in the previous embodiment. A part of the second insulator 152 may be disposed in a second fin-type pattern 102. The second insulator 152 may extend, along the third direction Z, from the second fin-type pattern 102 to an eighth gate structure G8.

The first and second insulators 151 and 152 may include an insulating material. For example, the first and second insulators 151 and 152 may include the same material as a field insulating film 105.

FIG. 11 illustrates that the first and second insulators 151 and 152 have different widths in a second direction Y, but the present disclosure is not limited thereto. Each of the first and second insulators 151 and 152 may have uniform width as desired, e.g., in the first direction X and/or in the second directions Y. Also, FIG. 12 illustrates the fifth wire patterns 115 are disposed on both sidewalls of the first insulator 151, but the present disclosure is not limited thereto. Alternatively, the fifth wire patterns 115 on the sidewalls of the first insulator 151 may be removed. For example, in certain embodiments, the fifth transistor may not include the fifth wire patterns 115 but may include the first insulator 151.

FIG. 12 illustrates that the first insulator 151 is a single-layer film, but the present disclosure is not limited thereto. For example, the first insulator 151 may include a plurality of sub-layers of insulator films.

The seventh and eighth gate structures G7 and G8 may be disposed on the first and second insulators 151 and 152, respectively. The seventh and eighth gate structures G7 and G8 may extend in the second direction Y.

The seventh gate structure G7 may include a seventh interface film 721, a seventh high dielectric constant insulating film 722, a seventh gate electrode 723, and seventh gate spacers 724. The seventh interface film 721 may be disposed on the first insulator 151. The seventh gate electrode 723 may be disposed on the seventh interface film 721. The seventh gate spacers 724 may be disposed on both sidewalls of the seventh gate electrode 723. The seventh high dielectric constant insulating film 722 may be disposed between the seventh gate electrode 723 and the seventh gate spacers 724 and between the seventh gate electrode 723 and the seventh interface film 721.

A semiconductor device according to some embodiments of the present disclosure will hereinafter be described with reference to FIGS. 13 and 14. For brevity, descriptions of elements or features that have already been described above may be omitted or simplified.

Figure 13:
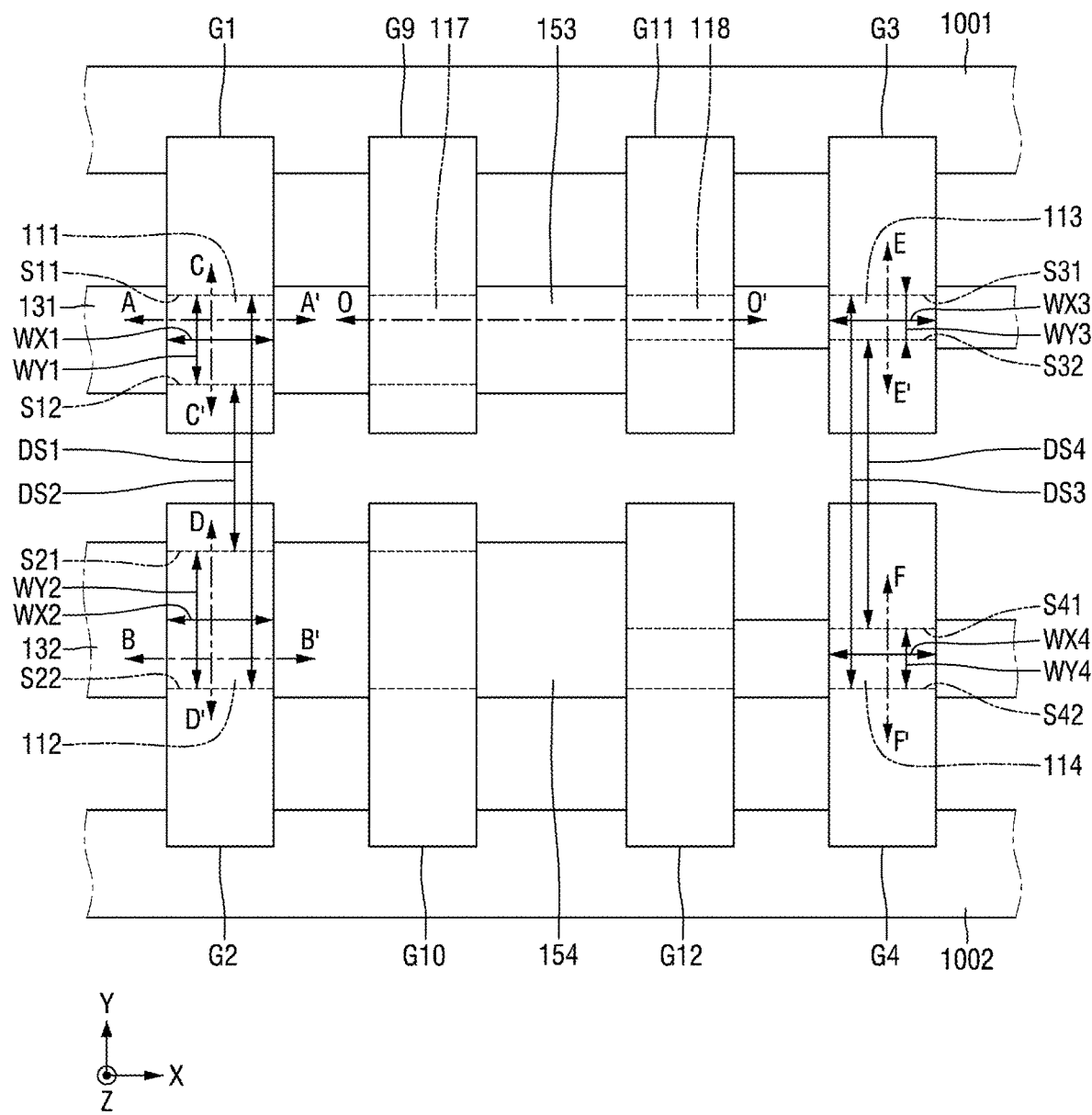
FIG. 13 is a layout view of a semiconductor device according to some embodiments of the present disclosure.

FIG. 13 is a layout view of a semiconductor device according to some embodiments of the present disclosure. FIG. 14 is a cross-sectional view taken along line O-O' of FIG. 13.

Figure 14:
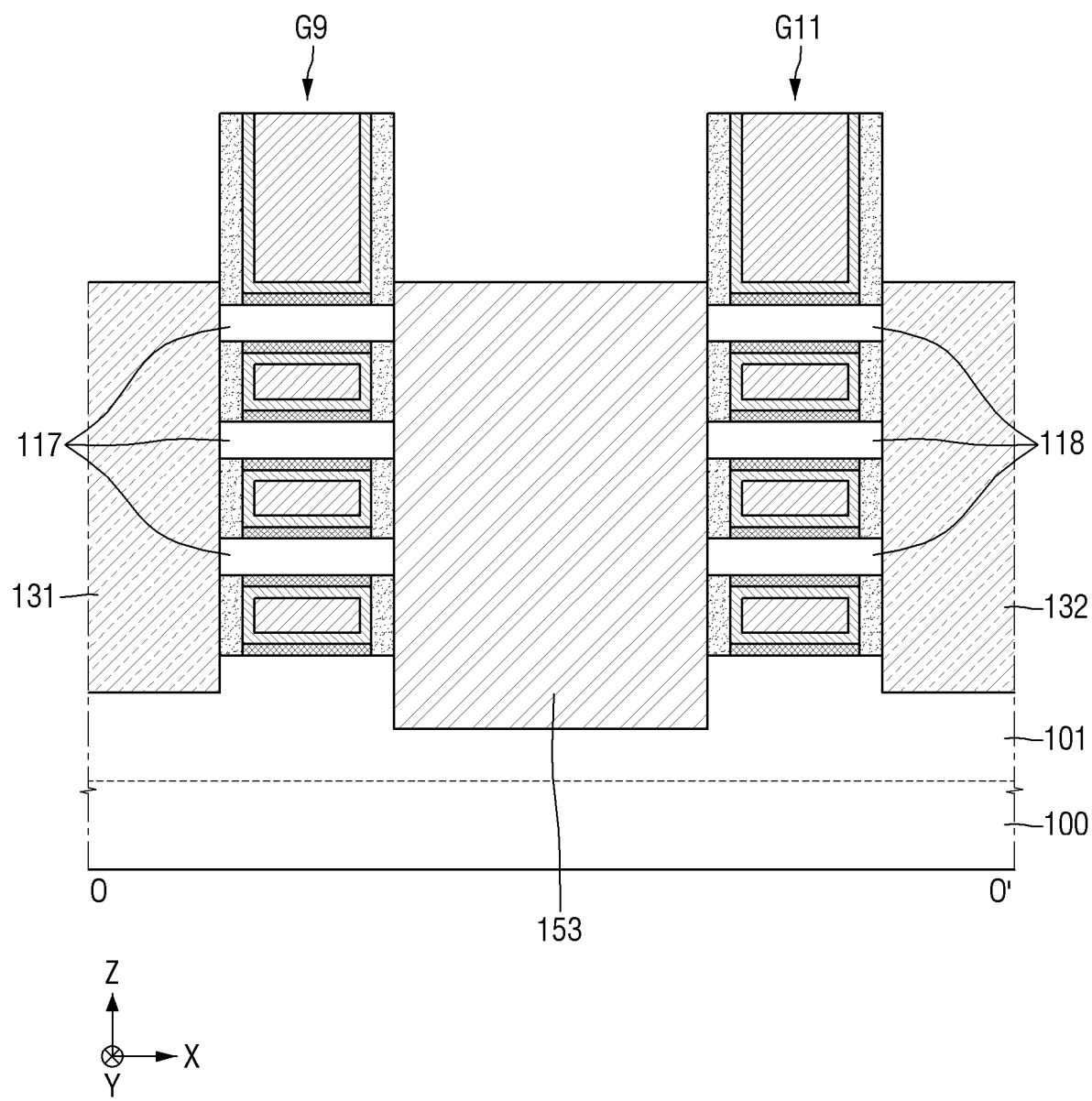
FIG. 14 is a cross-sectional view taken along line O-O' of FIG. 13.

Referring to FIGS. 13 and 14, the semiconductor device according to some embodiments of the present disclosure may include third and fourth insulators 153 and 154.

Ninth, tenth, eleventh, and twelfth gate structures G9, G10, G11, and G12 may extend in a second direction Y.

The ninth and eleventh gate structures G9 and G11 may be disposed between the first and third gate structures G1 and G3. The ninth and eleventh gate structures G9 and G11 may be spaced apart from each other in a first direction X with a third insulator 153 interposed therebetween. The ninth gate structure G9 may overlap with a plurality of seventh wire patterns 117 in a third direction Z. The eleventh gate structure G11 may overlap with a plurality of eighth wire patterns 118 in the third direction Z. For example, the first, second and third directions may be perpendicular to each other.

The tenth and twelfth gate structures G10 and G12 may be disposed between the second and fourth gate structures G2 and G4. The tenth and twelfth gate structures G10 and G12 may be spaced apart from each other in the first direction X with a fourth insulator 154 interposed therebetween.

The third insulator 153 may be disposed on a first sidewall of the eleventh gate structure G11 and on a second sidewall of the ninth gate structure G9. The fourth insulator 154 may be disposed on a first sidewall of the twelfth gate structure G12 and on a second sidewall of the tenth gate structure G10. A part of the third insulator 153 may be disposed in a first fin-type pattern 101.

For example, the third insulator 153 may be in contact with each of a plurality of seventh wire patterns 117 and each of a plurality of eighth wire patterns 118.

The third and fourth insulators 153 and 154 may include an insulating material. For example, the third and fourth insulators 153 and 154 may include the same material as a field insulating film 105.

FIG. 13 illustrates that the third and fourth insulators 153 and 154 have different widths in a second direction Y, but the present disclosure is not limited thereto. Each of the third and fourth insulators 153 and 154 may have uniform width as necessary, e.g., in the first direction X and/or in the second direction Y.

FIG. 14 illustrates that the third insulator 153 is a single-layer film, but the present disclosure is not limited thereto. For example, the third insulator 153 may include a plurality of sub-layers of films.

A semiconductor device according to some embodiments of the present disclosure will hereinafter be described with reference to FIGS. 15 and 16. For brevity, descriptions of elements or features that have already been described above may be omitted or simplified.

Figure 15:
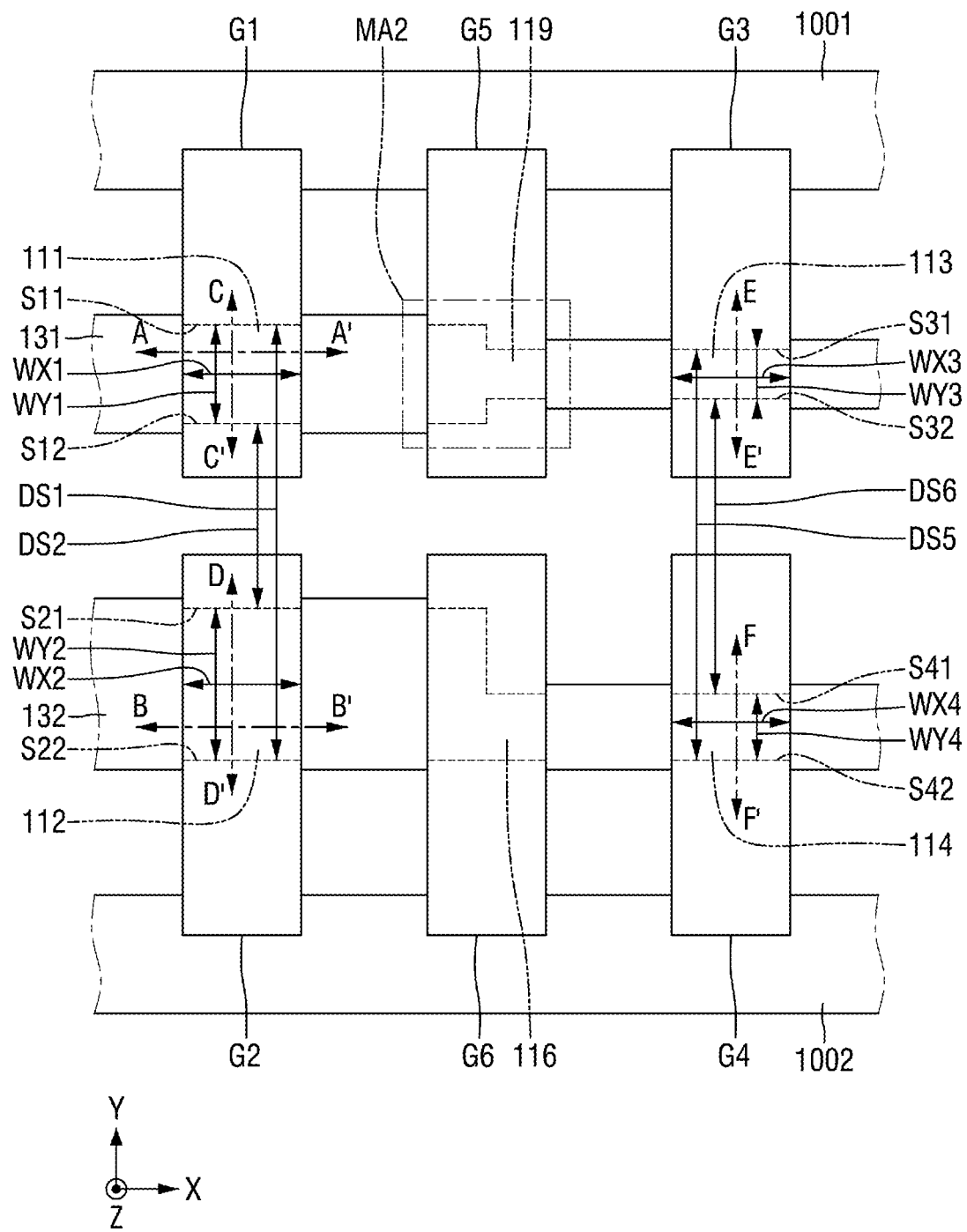
FIG. 15 is a layout view of a semiconductor device according to some embodiments of the present disclosure.

FIG. 15 is a layout view of a semiconductor device according to some embodiments of the present disclosure. FIG. 16 is an enlarged view illustrating an area MA2 of FIG. 15.

Figure 16:
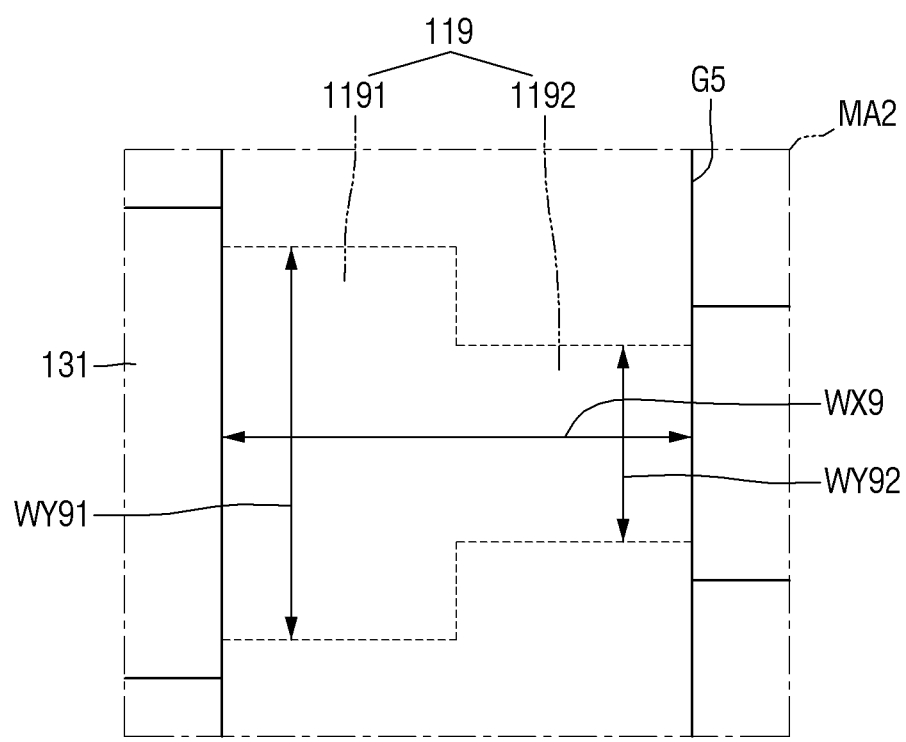
FIG. 16 is an enlarged view illustrating an area MA2 of FIG. 15.

The semiconductor device of FIGS. 15 and 16 is similar to the semiconductor device of FIGS. 7 through 10, but differs from the semiconductor device of FIGS. 7 through 10 in that first surfaces S11 of a plurality of first wire patterns 111 that face a first power rail 1001 in a second direction Y and first surfaces S31 of a plurality of third wire patterns 113 that also face the first power rail 1001 in the second direction Y may not be located on the same XZ plane, but may be located in different XZ planes.

Referring to FIGS. 15 and 16, a fifth distance DS5 may be different from a first distance DS1.

Second surfaces S12 of the first wire patterns 111 and second surfaces S32 of the third wire patterns 113 may not be located on the same plane. For example, the second surfaces S12 of the first wire patterns 111 and the second surfaces S32 of the third wire patterns 113 may be in different XZ planes.

The distance between the first surfaces S31 of the third wire patterns 113 and second surfaces S42 of a plurality of fourth wire patterns 114 may be the fifth distance DS5. The distance between the second surfaces S32 of the third wire patterns 113 and the first surfaces S41 of the fourth wire patterns 114 may be a sixth distance DS6.

In some embodiments, the first distance DS1 may be greater than the fifth distance DS5. The fifth distance DS5 may be greater than the sixth distance DS6. The sixth distance DS6 may be greater than a second distance DS2.

A plurality of ninth wire patterns 119 may include first portions 1191 and second portions 1192, which are parallel/connected to the first portions 1191 in a first direction X. The first portions 1191 of the ninth wire patterns 119 may have a width WY91 in the second direction Y. The second portions 1192 of the ninth wire patterns 119 may have a width WY92 in the second direction Y, and the width WY92 may be smaller than the width WY91. In some embodiments, the width WY91 may be the same as a width WY1, in the second direction Y, of the first wire patterns 111, and the width WY92 may be the same as a width WY3, in the second direction Y, of the third wire patterns 113.

For example, a width WX1, in the first direction X, of the first wire patterns 111, a width WX2, in the first direction X, of a plurality of second wire patterns 112, a width WX3, in the first direction X, of the third wire patterns 113, a width WX4, in the first direction X, of the fourth wire patterns 114, and a width WX9, in the first direction X, of the ninth wire patterns 119 may be substantially the same.

A semiconductor device according to some embodiments of the present disclosure will hereinafter be described with reference to FIG. 17. For brevity, descriptions of elements or features that have already been described above may be omitted or simplified.

Figure 17:
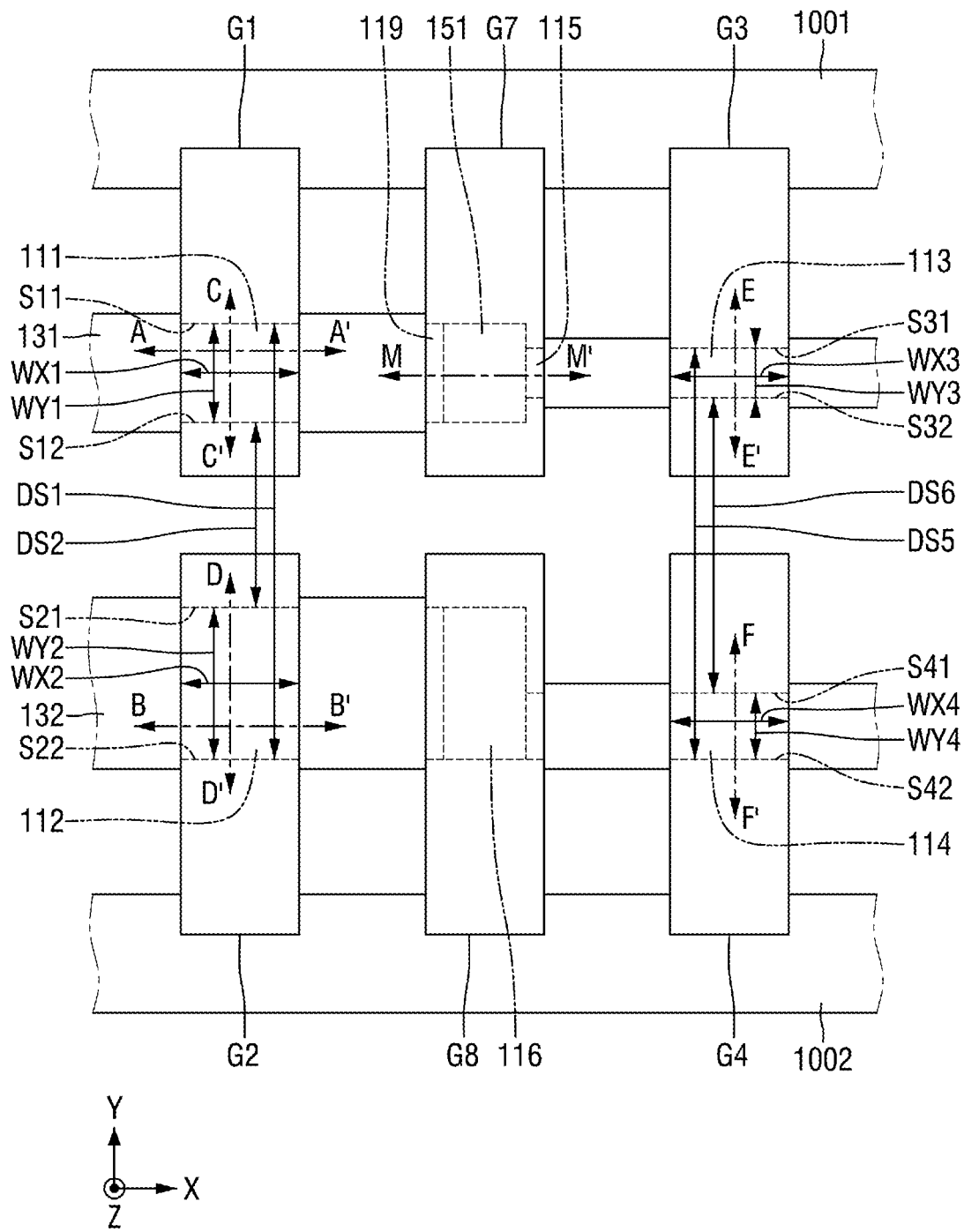
FIG. 17 is a layout view of a semiconductor device according to some embodiments of the present disclosure.

FIG. 17 is a layout view of a semiconductor device according to some embodiments of the present disclosure.

The semiconductor device of FIG. 17 is similar to the semiconductor device of FIGS. 11 and 12, but differs from the semiconductor device of FIGS. 11 and 12 in that first surfaces S11 of a plurality of first wire patterns 111 that face a first power rail 1001 in a second direction Y and first surfaces S31 of a plurality of third wire patterns 113 that also face the first power rail 1001 in the second direction Y are not located on the same XZ plane. For example, the first surfaces S11 of the first wire patterns 111 may be in a different XZ plane than the first surfaces S31 of the third wire patterns 113.

Referring to FIG. 17, a fifth distance DS5 may be different from a first distance DS1.

A plurality of ninth wire patterns 119 may be disposed on both sidewalls of a first insulator 151, but the present disclosure is not limited thereto. For example, the ninth wire patterns 119 may not be provided.

A semiconductor device according to some embodiments of the present disclosure will hereinafter be described with reference to FIG. 18. For brevity, descriptions of elements or features that have already been described above may be omitted or simplified.

Figure 18:
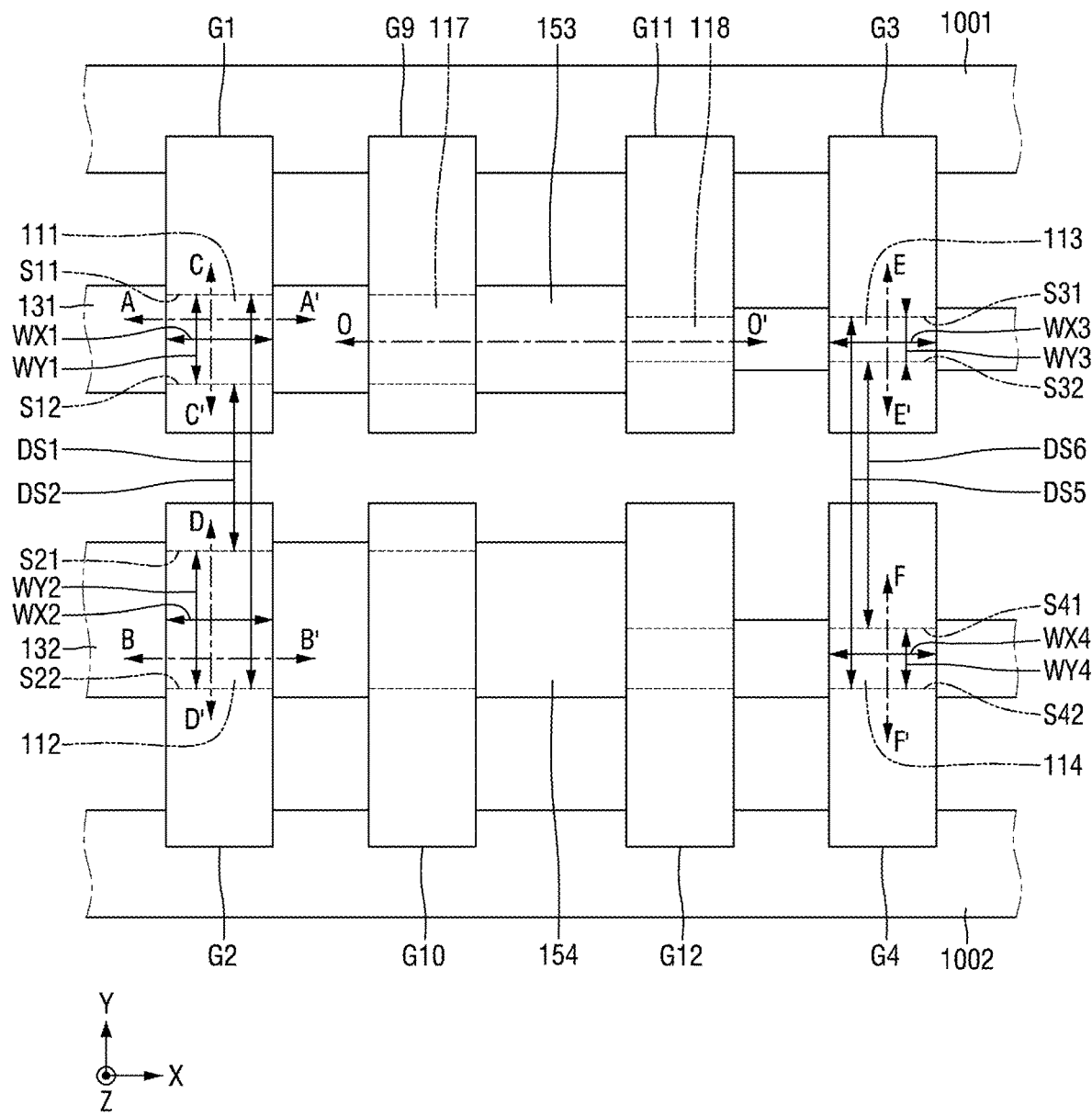
FIG. 18 is a layout view of a semiconductor device according to some embodiments of the present disclosure.

FIG. 18 is a layout view of a semiconductor device according to some embodiments of the present disclosure.

The semiconductor device of FIG. 18 is similar to the semiconductor device of FIGS. 13 and 14, but differs from the semiconductor device of FIGS. 13 and 14 in that first surfaces S11 of a plurality of first wire patterns 111 that face a first power rail 1001 in a second direction Y and first surfaces S31 of a plurality of third wire patterns 113 that also face the first power rail 1001 in the second direction Y are not located on the same XZ plane. For example, the first surfaces S11 of the first wire patterns 111 may be disposed in a different XZ plane than the first surfaces S31 of the third wire patterns 113.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A semiconductor device comprising:
   a first wire pattern disposed on a substrate and extending in a first direction;
   a first gate electrode surrounding the first wire pattern and extending in a second direction, the first direction intersecting the second direction perpendicularly;
   a first transistor including the first wire pattern and the first gate electrode;
   a second wire pattern disposed on the substrate and extending in the first direction;
   a second gate electrode surrounding the second wire pattern and extending in the second direction;
   a second transistor including the second wire pattern and the second gate electrode,
   one or more third wire patterns disposed above the first wire pattern in a third direction perpendicular to the first and second directions and extending in the first direction; and
   one or more fourth wire patterns disposed above the second wire pattern in the third direction and extending in the first direction,
   wherein a width of the first wire pattern in the second direction is different from a width of the second wire pattern in the second direction,
   wherein the first gate electrode surrounds each of the third wire patterns,
   wherein the second gate electrode surrounds each of the fourth wire patterns, and
   wherein a total number of wire patterns overlapping with the first wire pattern in the third direction including the third wire patterns is different from a total number of wire patterns overlapping with the second wire pattern in the third direction including the fourth wire patterns.

2. The semiconductor device of claim 1, wherein a width of each of the third wire patterns in the second direction is different from a width of each of the fourth wire patterns in the second direction.

3. The semiconductor device of claim 1, wherein a width of the first wire pattern in the first direction is the same as a width of the second wire pattern in the first direction.

4. The semiconductor device of claim 1, further comprising:
a fifth wire pattern disposed on the substrate between the first and second wire patterns in a plan view, the fifth wire pattern extending in the first direction; and
a third gate electrode surrounding the fifth wire pattern and extending in the second direction,
wherein:
the fifth wire pattern includes a first portion and a second portion adjacent to each other in the first direction, and
a width of the first portion of the fifth wire pattern in the second direction is different from a width of the second portion of the fifth wire pattern in the second direction.

5. The semiconductor device of claim 4, wherein:
the width of the first portion of the fifth wire pattern in the second direction is the same as the width of the first wire pattern in the second direction, and
the width of the second portion of the fifth wire pattern in the second direction is the same as the width of the second wire pattern in the second direction.

6. The semiconductor device of claim 1, wherein channel areas of the first and second transistors have the same electrical polarity.

7. The semiconductor device of claim 1, wherein channel areas of the first and second transistors have different electrical polarities from each other.

8. The semiconductor device of claim 7, wherein the first and second gate electrodes are directly connected to each other in the second direction.

9. The semiconductor device of claim 1, wherein:
the first transistor is formed in a logic region of the substrate, and
the second transistor is formed in a static random access memory (SRAM) forming region of the substrate.

10. A semiconductor device comprising:
a first wire pattern disposed on a substrate and extending in a first direction;
a second wire pattern disposed on the substrate and extending in the first direction, the second wire pattern being spaced apart from the first wire pattern in a second direction, the first direction intersecting the second direction perpendicularly;
a third wire pattern disposed on the substrate and extending in the first direction, the third wire pattern being spaced apart from the first wire pattern in the first direction; and
a fourth wire pattern disposed on the substrate and extending in the first direction, the fourth wire pattern being spaced apart from the second wire pattern in the first direction and from the third wire pattern in the second direction,
wherein:
the first wire pattern includes a first surface and a second surface opposite to each other in the second direction,
the second wire pattern includes a third surface and a fourth surface opposite to each other in the second direction,
the third wire pattern includes a fifth surface and a sixth surface opposite to each other in the second direction,
the fourth wire pattern includes a seventh surface and a eighth surface opposite to each other in the second direction,
a first distance between the first and fourth surfaces is greater than a second distance between the second and third surfaces,
a third distance between the fifth and eighth surfaces is greater than a fourth distance between the sixth and seventh surfaces,
the first distance is the same as the third distance, and
the second distance is different from the fourth distance.

11. The semiconductor device of claim 10, further comprising:
a first gate electrode surrounding the first wire pattern and extending in the second direction;
a second gate electrode surrounding the second wire pattern and extending in the second direction;
a third gate electrode surrounding the third wire pattern and extending in the second direction; and
a fourth gate electrode surrounding the fourth wire pattern and extending in the second direction.

12. The semiconductor device of claim 11, further comprising:
a plurality of fifth wire patterns disposed above the first wire pattern in a third direction perpendicular to the first and second directions, the plurality of fifth wire patterns extending in the first direction; and
a plurality of sixth wire patterns disposed above the second wire pattern in the third direction, the plurality of sixth wire patterns extending in the first direction,
wherein:
the first gate electrode surrounds each of the fifth wire patterns,
the second gate electrode surrounds each of the sixth wire patterns, and
the number of fifth wire patterns is different from the number of sixth wire patterns.

13. The semiconductor device of claim 11, further comprising:
a plurality of fifth wire patterns disposed above the first wire pattern and extending in the first direction; and
a plurality of sixth wire patterns disposed above the third wire pattern and extending in the first direction,
wherein:
the first gate electrode surrounds each of the fifth wire patterns,
the third gate electrode surrounds each of the sixth wire patterns, and
the number of fifth wire patterns is different from the number of sixth wire patterns.

14. The semiconductor device of claim 10, further comprising:
a fifth wire pattern disposed on the substrate between the first and third wire patterns in a plan view, the fifth wire pattern extending in the first direction,
wherein:
the fifth wire pattern includes a first portion and a second portion, and a width of the first portion of the fifth wire pattern in the second direction is different from a width of the second portion of the fifth wire pattern in the second direction.

15. The semiconductor device of claim 10, further comprising:
   a first power rail spaced apart from the first and third wire patterns in the second direction; and
   a second power rail spaced apart from the second and fourth wire patterns in the second direction,
   wherein the first through fourth wire patterns are disposed between the first and second power rails.

16. A semiconductor device comprising:
   a first wire pattern disposed on a substrate and extending in a first direction;
   a first gate electrode surrounding the first wire pattern and extending in a second direction, the second direction intersecting the first direction perpendicularly;
   a second wire pattern disposed on the substrate and extending in the first direction, the second wire pattern being spaced apart from the first wire pattern in the first direction;
   a second gate electrode surrounding the second wire pattern and extending in the second direction;
   a first insulator disposed on the substrate between the first and second wire patterns in a plan view; and
   a third gate electrode extending in the second direction and disposed on the first insulator, the third gate electrode disposed between the first and second gate electrodes,
   wherein a width of the first wire pattern in the second direction is different from a width of the second wire pattern in the second direction.

17. The semiconductor device of claim 16, further comprising:
   a plurality of third wire patterns disposed above the first wire pattern and extending in the first direction; and
   a plurality of fourth wire patterns disposed above the second wire pattern and extending in the first direction,
   wherein:
      the first gate electrode surrounds each of the third wire patterns,
      the second gate electrode surrounds each of the fourth wire patterns, and
      the number of third wire patterns is different from the number of fourth wire patterns.

18. The semiconductor device of claim 16, further comprising:
   a third wire pattern spaced apart from the first wire pattern in the second direction, disposed on the substrate, and extending in the first direction; and
   a fourth gate electrode surrounding the third wire pattern and extending in the second direction,
   wherein a width of the third wire pattern in the second direction is different from a width of the second wire pattern in the second direction.

19. The semiconductor device of claim 18, further comprising:
   a fourth wire pattern spaced apart from the second wire pattern in the second direction, disposed on the substrate, and extending in the first direction; and
   a fifth gate electrode surrounding the fourth wire pattern and extending in the second direction,
   wherein a width of the fourth wire pattern in the second direction is different from a width of the first wire pattern in the second direction.

20. The semiconductor device of claim 19, further comprising:
   a second insulator disposed on the substrate between the third and fourth wire patterns; and
   a sixth gate electrode extending in the second direction and disposed on the second insulator, the sixth gate electrode disposed between the fourth and fifth gate electrodes.

* * * * *